US012700847B2

(12) United States Patent　　　　(10) Patent No.:　US 12,700,847 B2

Kanazawa　　　　　　　　　　　　　　(45) Date of Patent:　　　Aug. 4, 2026

(54) ELASTIC WAVE DEVICE, FILTER, SPLITTER, AND COMMUNICATION DEVICE

(71) Applicant: KYOCERA Corporation, Kyoto (JP)

(72) Inventor: Tomio Kanazawa, Daito (JP)

(73) Assignee: Kyocera Corporation, Kyoto (JP)

( * ) Notice: Subject to any disclaimer, the term of this patent is extended or adjusted under 35 U.S.C. 154(b) by 174 days.

(21) Appl. No.: 18/576,874

(22) PCT Filed: Jul. 8, 2022

(86) PCT No.: PCT/JP2022/027079

§ 371 (c)(1),
(2) Date: Jan. 5, 2024

(87) PCT Pub. No.: WO2023/286704

PCT Pub. Date: Jan. 19, 2023

(65) Prior Publication Data

US 2024/0339986 A1　　　Oct. 10, 2024

(30) Foreign Application Priority Data

Jul. 16, 2021　(JP) ................................. 2021-117708

(51) Int. Cl.
H03H 9/02　　　　(2006.01)
H03H 9/145　　　(2006.01)
(Continued)

(52) U.S. Cl.
CPC ........ H03H 9/02992 (2013.01); H03H 9/145 (2013.01); H03H 9/25 (2013.01); H03H 9/6483 (2013.01)

(58) Field of Classification Search
CPC ........ H03H 9/145; H03H 9/25; H03H 9/1457; H03H 9/64; H03H 9/72; H03H 9/14544;
(Continued)

(56) References Cited

U.S. PATENT DOCUMENTS 12,355,425 B2 * 7/2025 Daimon ............. H03H 9/02992
2018/0097508 A1 4/2018 Iwamoto et al.
(Continued)

FOREIGN PATENT DOCUMENTS

CN　　　113364421 A　*　9/2021　......... H03H 9/02661
JP　　　S56-054114 A　　5/1981
(Continued)

*Primary Examiner* — Quan Tra
(74) *Attorney, Agent, or Firm* — Volpe Koenig

(57)　　　　　　ABSTRACT

An IDT electrode includes: a first busbar, a second busbar facing the first busbar, multiple first electrode fingers electrically connected to the first busbar, multiple second electrode fingers electrically connected to the second busbar and arranged in an alternating manner with the multiple first electrode fingers in an acoustic wave propagation direction, multiple bar electrodes interposed between the first busbar and the multiple first electrode fingers, and extending parallel to the first busbar and parallel to each other, multiple connection portions including a connection portion that is interposed between the first busbar and a corresponding one of the bar electrodes adjacent to the first busbar and that connects the first busbar to the corresponding bar electrode, and a connection portion that connects adjacent bar electrodes to each other. Some of the connection portions are disposed in a discontinuous manner with respect to an extension direction of the multiple electrode fingers.

20 Claims, 20 Drawing Sheets

(51) Int. Cl.
    *H03H 9/25*      (2006.01)
    *H03H 9/64*      (2006.01)

(58) Field of Classification Search
    CPC .............. H03H 9/02992; H03H 9/725; H03H
                            9/02574; H03H 9/6483
    See application file for complete search history.

(56)                   References Cited

U.S. PATENT DOCUMENTS

| | | |
|---|---|---|
| 2020/0153414 A1 | 5/2020 | Takamine |
| 2021/0313961 A1 | 10/2021 | Huck |

FOREIGN PATENT DOCUMENTS

| | | |
|---|---|---|
| JP | H10-173467 A | 6/1998 |
| JP | H11-261370 A | 9/1999 |
| JP | 2015-056746 A | 3/2015 |
| JP | 2021-077956 A | 5/2021 |
| WO | 2016/208446 A1 | 12/2016 |
| WO | 2019/017422 A1 | 1/2019 |
| WO | 2020/120153 A1 | 6/2020 |

* cited by examiner

ELASTIC WAVE DEVICE, FILTER, SPLITTER, AND COMMUNICATION DEVICE

TECHNICAL FIELD

The present disclosure relates to an acoustic wave device capable of at least one out of converting acoustic waves to electrical signals and converting electrical signals to acoustic waves, a filter including the acoustic wave device, a splitter including the filter, and a communication device including the splitter.

BACKGROUND OF INVENTION

A known acoustic wave device includes a piezoelectric layer and an interdigital transducer (IDT) electrode positioned on the piezoelectric layer (for example, Patent Literature 1 listed below). The IDT electrode includes a pair of comb electrodes. Each comb electrode includes a busbar and multiple electrode fingers extending parallel to each other from the busbar. The pair of comb electrodes are disposed so as to mesh with each other. Patent Literature 1 discloses an IDT electrode in which the busbars are provided with multiple openings arranged in the direction in which the busbars extend.

CITATION LIST

Patent Literature

Patent Literature 1: Japanese Unexamined Patent Application Publication No. 2021-77956

SUMMARY

In an embodiment of the present disclosure, an acoustic wave device includes a piezoelectric body and an IDT electrode. The piezoelectric body has a first surface. The IDT electrode is positioned on the first surface. The IDT electrode includes a first busbar, a second busbar, multiple first electrode fingers, multiple second electrode fingers, multiple bar electrodes, and multiple connection portions. The second busbar faces the first busbar. The multiple first electrode fingers are electrically connected to the first busbar. The multiple second electrode fingers are electrically connected to the second busbar and are arranged in an alternating manner with the multiple first electrode fingers in an acoustic wave propagation direction. The multiple bar electrodes are interposed between the first busbar and the multiple first electrode fingers, and extend parallel to the first busbar and parallel to each other. The multiple connection portions include a connection portion that is interposed between the first busbar and a corresponding one of the bar electrodes adjacent to the first busbar and that connects the first busbar to the corresponding one of the bar electrodes, and a connection portion that is interposed between and connects adjacent bar electrodes, among the bar electrodes, to each other. At least some of the multiple connection portions are disposed in a discontinuous manner with respect to an extension direction of the multiple first electrode fingers.

In an embodiment of the present disclosure, a filter includes the acoustic wave device and one or more other IDT electrodes located on the first surface, connected to the IDT electrode in a ladder configuration, and constituting a ladder filter.

In an embodiment of the present disclosure, a filter includes the acoustic wave device and one or more other IDT electrodes located on the first surface, arranged in the acoustic wave propagation direction with respect to the IDT electrode, and constituting a multi-mode filter.

In an embodiment of the present disclosure, a splitter includes an antenna terminal, a transmission filter connected to the antenna terminal, and a reception filter connected to the antenna terminal. At least one out of the transmission filter and the reception filter is constituted by either one of the above filters.

In an embodiment of the present disclosure, a communication device includes the splitter, an antenna, and an integrated circuit (IC). The antenna is connected to the antenna terminal. The IC is connected to the transmission filter and the reception filter.

DESCRIPTION OF EMBODIMENTS

Figure 1:
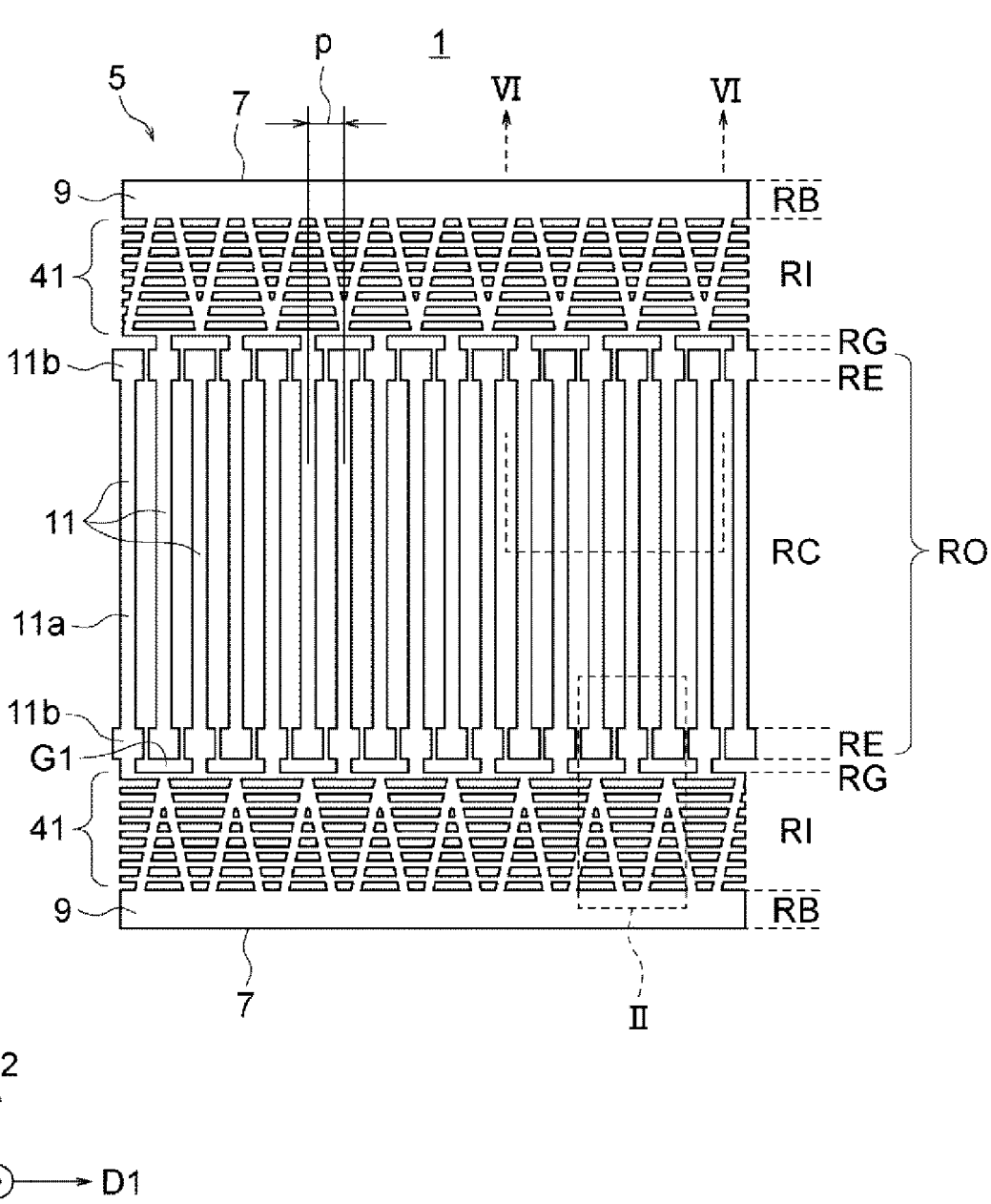
FIG. 1 is a plan view illustrating the configuration of an acoustic wave device according to an embodiment.

Hereafter, embodiments according to the present disclosure will be described while referring to the drawings. The drawings used in the following description are schematic drawings. The dimensional ratios and so on in the drawings do not necessarily match the actual dimensional ratios and so on. There may be cases where the dimensional ratios and so on do not match between the drawings. Certain shapes or dimensions may be illustrated in an exaggerated fashion.

Any direction may be considered up or down with respect to the acoustic wave device according to the present disclosure. However, for convenience, a Cartesian coordinate system consisting of a D1 axis, a D2 axis, and a D3 axis is defined below, and terms such as top surface or bottom surface may be used, with the positive side of the D3 axis being on the upper side. When terms such as viewed in plan view or viewed in planar perspective view are used, we mean looking in the D3 direction, unless otherwise noted. The D1 axis is defined as parallel to the propagation direction of acoustic waves propagating along the top surface of a piezoelectric body, which will be described below, the D2 axis is defined as parallel to the top surface of the piezoelectric body and perpendicular to the D1 axis, and the D3 axis is defined as perpendicular to the top surface of the piezoelectric body.

<Acoustic Wave Device>

(Overview of Acoustic Wave Device)

FIG. 1 is a plan view illustrating main parts of an acoustic wave device 1 according to an embodiment (hereafter, may be simply referred to as a "device 1").

The device 1 includes, for example, a piezoelectric body 3 (refer to FIG. 6 and so on described later) and an IDT electrode 5 positioned on a top surface 3a (example of a first surface) of the piezoelectric body 3. FIG. 1 is a plan view of the top surface 3a. However, symbols relating to the piezoelectric body 3 and illustration of the outer edge of the top surface 3a and so on are omitted.

Acoustic waves that propagate in the D1 direction through a crossing region R0 of the piezoelectric body 3 (region in center of IDT electrode 5 in D2 direction) are excited by applying a voltage to the IDT electrode 5. And/or when acoustic waves propagate in the D1 direction through the crossing region R0, charge is generated in the piezoelectric body 3 and a voltage is applied to the IDT electrode 5. The device 1 may, for example, be included in a resonator and/or a filter that utilizes this kind of conversion between acoustic waves and a voltage (electrical signal). Hereafter, the D1 direction may be referred to as an acoustic wave propagation direction or a propagation direction, and so on.

The IDT electrode 5 is composed of a conductor layer stacked on the top surface 3a of the piezoelectric body 3. The IDT electrode 5 includes a pair of comb electrodes 7. Each comb electrode 7 includes, for example, a busbar 9 and multiple electrode fingers 11 electrically connected to the busbar 9. The pair of comb electrodes 7 are disposed so that the multiple electrode fingers 11 mesh with each other (cross each other). The crossing region R0 is a region in which the multiple electrode fingers 11 of one comb electrode 7 and the multiple electrode fingers 11 of the other comb electrode 7 overlap each other in the acoustic wave propagation direction.

Generally, in each comb electrode 7, the multiple electrode fingers 11 extend from the busbar 9. In other words, the electrode fingers 11 and the busbar 9 are directly connected to each other. However, in this embodiment, each comb electrode 7 includes an intervening electrode 41 interposed between the busbar 9 and the multiple electrode fingers 11. As a result, for example, transverse mode spurious can be reduced, as described in detail later.

Other than the intervening electrodes 41, the device 1 may have any of various known configurations, for example, may have a known configuration. Description of parts that may have known configurations will be omitted from the description as appropriate.

In the description of the embodiments, the description will generally be given in the following order.

IDT electrode 5 (mainly parts other than the intervening electrodes 41) (FIG. 1)

Figure 2:
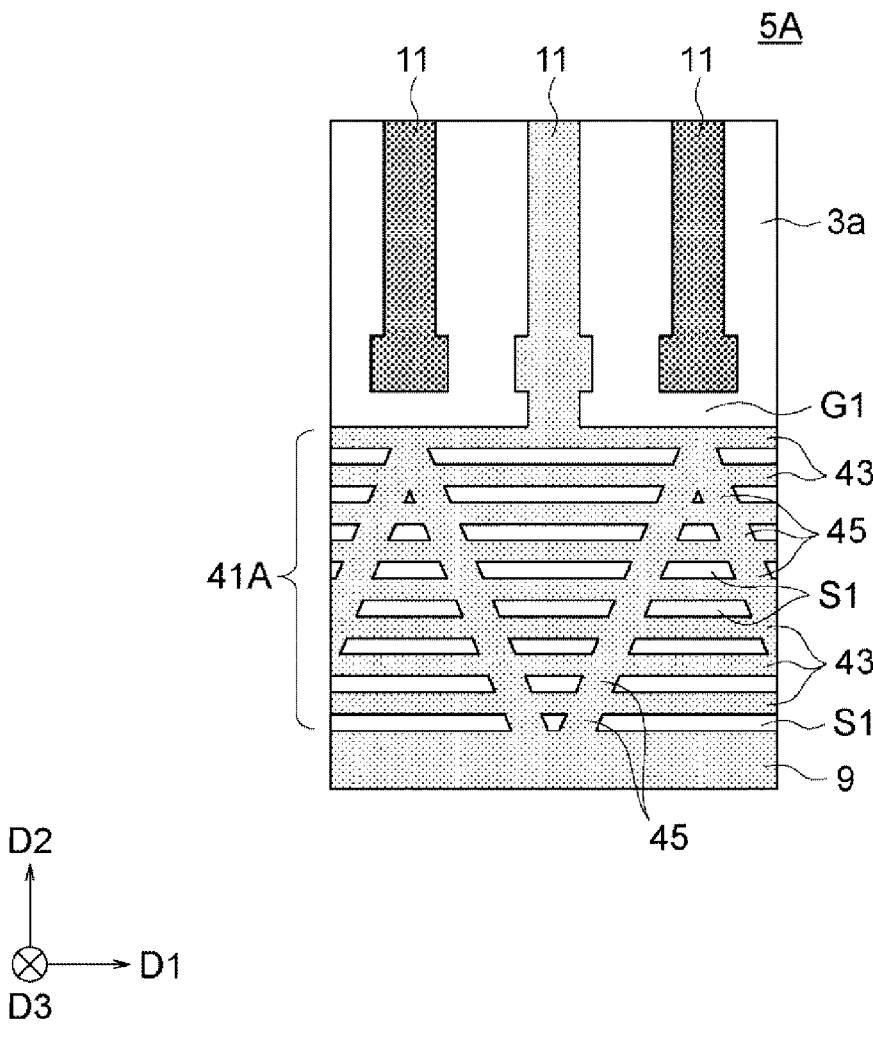
FIG. 2 is an enlarged view of a region II in FIG. 1 and is a diagram illustrating part of a specific example of an IDT electrode.

Intervening electrodes 41 (FIG. 2)

Various specific examples of IDT electrode 5 (particularly intervening electrodes 41) (FIGS. 2 to 5)

Velocity profile of acoustic waves (FIG. 1)

Figure 6:
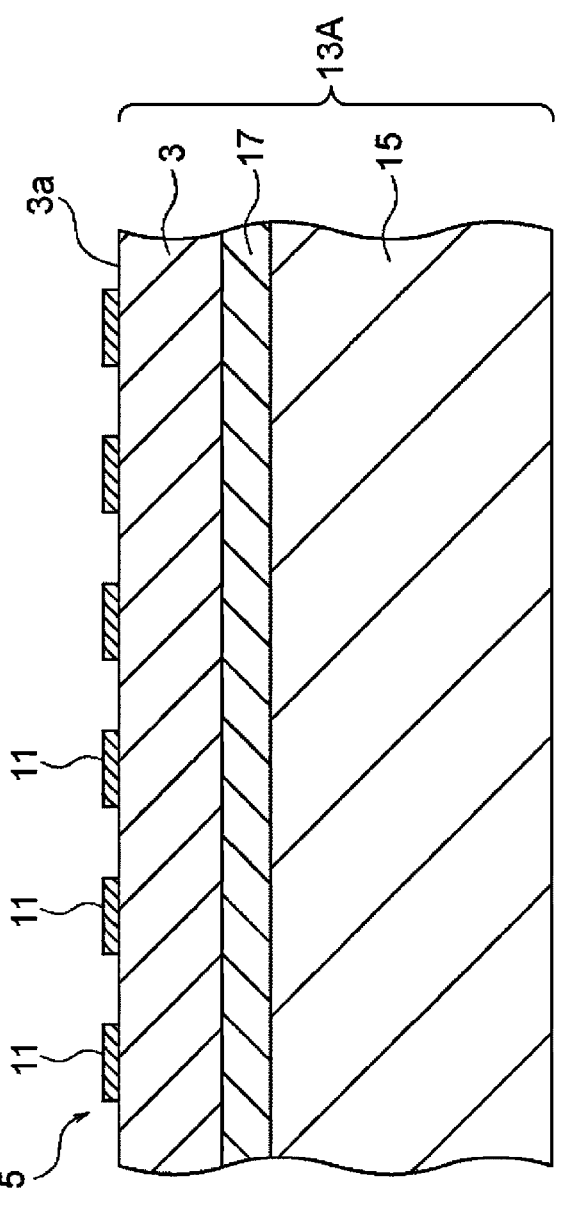
FIG. 6 is a diagram illustrating an example of a cross section taken along line VI-VI in FIG. 1.
Figure 6:
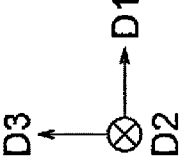
Figure 7:
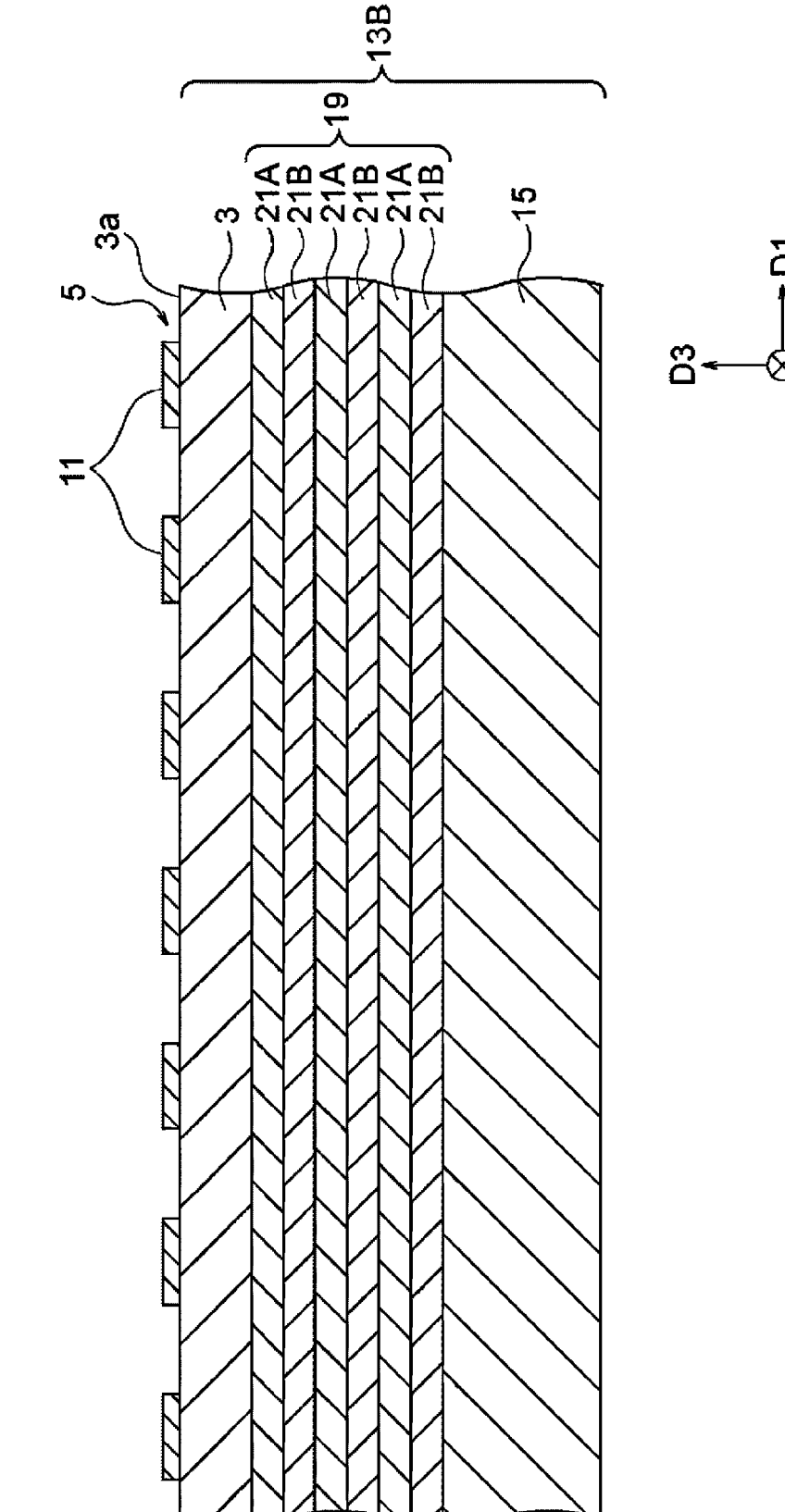
FIG. 7 is a diagram illustrating another example of a cross section taken along line VI-VI in FIG. 1.

Various example configurations of substrates including piezoelectric body (FIGS. 6 and 7)

Other configurations of acoustic wave devices

Summary of acoustic wave device (IDT Electrode)

The busbars 9 are, for example, formed in a generally long shape having a constant width and extending in a straight line in the acoustic wave propagation direction (D1 direction). The pair of busbars 9 face each other in a direction (D2 direction) perpendicular to the acoustic wave propagation direction. The edge of each busbar 9 on the side where the crossing region R0 is located is straight, for example. In addition, the edges of the pair of busbars 9 on the sides where the crossing region R0 is located are, for example, parallel to each other (the concept of "parallel" may be extended to include "curved"). From another perspective, the distance between the two edges (in the D2 direction) is constant regardless of the position in the D1 direction.

Unlike in the illustrated example, the busbars 9 may vary in width or be inclined with respect to the acoustic wave propagation direction. In each busbar 9, the edge on the side where the crossing region R0 is located may be curved or may have a shape made up of multiple intersecting straight lines. In the pair of busbars 9, the distance between the edges facing each other may vary with the position in the D1 direction.

The length of busbars 9 (in the D1 direction) may be, for example, approximately equal to the product of a pitch p and the number of multiple electrode fingers 11 in the pair of comb electrodes 7. The width (in the D2 direction) of the busbars 9 may be chosen as appropriate. In general, the width of busbars 9 is greater than the width of the electrode fingers 11 (in the D1 direction). For example, the width of busbars 9 may be greater than or equal to 1p.

The multiple electrode fingers 11 have the same shape and dimensions as each other, for example. Unlike in the illustrated example, the multiple electrode fingers 11 may have different shapes and dimensions from each other. For example, the multiple electrode fingers 11 may have different lengths from each other. In other words, the IDT electrode 5 may be a so-called apodized IDT electrode.

Each electrode finger 11 is, for example, formed in a generally long shape with the centerline thereof extending in a straight line in a direction (D2 direction) perpendicular to the acoustic wave propagation direction. The electrode fingers 11 may extend with a constant width (length in the D1 direction) or may vary in width depending on the position in the length direction (D2 direction) (illustrated example). In the example illustrated in FIG. 1, each electrode finger 11 includes wider portions 11b, which are wider than the other major portion (main portion 11a) of the electrode finger 11, at the tip and the base side thereof. This allows a so-called piston mode (or a similar mode, the same applies hereafter) to be used, and this in turn, reduces transverse mode spurious. In the description of this embodiment, description may be made under the assumption that this is the case.

In each comb electrode 7, the multiple electrode fingers 11 are arranged in the acoustic wave propagation direction. In each comb electrode 7, a line (not illustrated) connecting the tips (or bases) of the multiple electrode fingers 11 is, for example, a straight line parallel to the propagation direction. However, unlike in the illustrated example, the line may be inclined with respect to the propagation direction, may be a curved line, or may have a shape made up of multiple intersecting straight lines. In a case in which a piston mode is used as described above, for example, the line may be straight, parallel or inclined with respect to the propagation direction.

The multiple electrode fingers 11 of one comb electrode 7 and the electrode fingers 11 of the other comb electrode 7 are arranged in an alternating manner in the acoustic wave propagation direction. In this case, the multiple electrode fingers 11 of one comb electrode 7 and the electrode fingers 11 of the other comb electrode 7 may be arranged in an alternating manner one by one (illustrated example), or may be arranged in an alternating manner in groups of two or more. There may be different parts resulting from so-called thinning or the like. In the description of this embodiment, a case in which the electrode fingers are arranged in an alternating manner one by one will be taken as an example.

A pitch p of the multiple electrode fingers 11 of the pair of comb electrodes 7 (for example, the distance between the centers of two adjacent electrode fingers 11) is basically constant within the IDT electrode 5. Note that the IDT electrode 5 may include some parts that are different in terms of the pitch p. Examples of such different parts include, for example, small pitch parts where the pitch p is smaller than that for the majority (for example, 80% or more) of the electrode fingers 11, large pitch parts where the pitch p is larger than that for the majority of the electrode fingers 11, and thinned parts where a small number of electrode fingers 11 have been substantially thinned out.

In the description of this embodiment, when the pitch p is referred to, unless otherwise specified, the pitch p refers to the pitch of the parts (majority of the multiple electrode fingers 11) excluding the different parts described above. In addition, in the case where the pitch changes even in the majority of the multiple electrode fingers 11 excluding the different parts, the average value of the pitch of the majority of the electrode fingers 11 may be used as the value of the pitch p.

The number of electrode fingers 11 may be set as appropriate in accordance with the electrical characteristics and so forth required for the IDT electrode 5 (device 1). FIG. 1 is a schematic diagram, and therefore a small number of the electrode fingers 11 are illustrated. In reality, a greater number of electrode fingers 11 may be arranged than is illustrated in the figure. For example, the number of electrode fingers 11 may be 100 or more. FIG. 1 may be considered to be an illustration of an extracted portion of the IDT electrode 5.

The tip of each electrode finger 11 of one comb electrode 7 faces an edge of the intervening electrode 41 of the other comb electrode 7 (more specifically, a bar electrode 43 (described later) closest to the electrode fingers 11) across a gap G1. The lengths of the multiple gaps G1 in the D2 direction are identical to each other, for example. The length may be set as appropriate, for example, greater than or equal to 0.1p and less than or equal to 0.5p.

When a voltage is applied to the pair of comb electrodes 7, the voltage is applied to the top surface 3a of the piezoelectric body 3 by the multiple electrode fingers 11, thereby causing the top surface of the piezoelectric body 3 to vibrate (if the piezoelectric body 3 is relatively thick) or causing the entire piezoelectric body 3 to vibrate (if the piezoelectric body 3 is relatively thin). This causes acoustic waves that propagate along the top surface 3a to be excited. When half the wavelength of the acoustic waves is approximately equal to the pitch p, the multiple acoustic waves excited by the multiple electrode fingers 11 are in phase with each other in a direction (D1 direction) perpendicular to the multiple electrode fingers 11 and the amplitudes of the acoustic waves add together. In other words, when the pitch p is set to half the wavelength, acoustic waves propagating in the D1 direction are most easily excited. As a result, out of the voltage applied to the IDT electrode 5, mainly, a component having a frequency equivalent to the frequency of the acoustic waves, whose half wavelength is roughly equal to the pitch p, is converted into acoustic waves. In addition, when acoustic waves are generated in the region of the top surface 3a where the pair of comb electrodes 7 are disposed, mainly, the acoustic waves propagating in the D1 direction, whose half wavelength is roughly equal to the pitch p, are converted into a voltage through a principle opposite to that described above. A resonator or filter is realized by using these principles.

In the device 1, acoustic waves of any appropriate mode may be utilized. For example, the acoustic waves may be surface acoustic waves (SAWs). For example, Rayleigh waves or leaky waves may be used as the SAWs. The acoustic waves may be Lamb waves propagating through a thin-plate-shaped piezoelectric body. For example, as Lamb waves, A1-mode Lamb waves, S0-mode Lamb waves, and shear horizontal (SH) Lamb waves may be used. The modes of acoustic waves do not need to be clearly identifiable or distinguishable in this way.

The pitch p of the electrode fingers 11 is basically half the wavelength of acoustic waves that have a frequency equivalent to the intended resonant frequency, as described above. An example of the absolute value of the pitch p is greater than or equal to 0.5 $\mu$m and less than or equal to 15 $\mu$m. The length (in the D2 direction) of the electrode fingers 11 may be, for example, greater than or equal to 10p or 20p, and may be less than or equal to 100p or 50p. These lower and upper limits may be combined in any manner.

The ratio of the width (in the D1 direction) of the electrode fingers 11 to twice the pitch p (2p) of the electrode fingers 11 (=width/2p) may be referred to as the duty ratio. The duty ratio may be set as appropriate. For example, the duty ratio of the main portions 11a (or electrode fingers 11 having a constant width over their entire length) may be greater than or equal to 0.40 or 0.45 and less than or equal to 0.60 or 0.55. These upper and lower limits may be combined in any manner. The duty ratio of the wider portions 11b may be greater than or equal to 0.50 or 0.55 and may be less than or equal to 0.80, 0.70, or 0.65, provided that the duty ratio of the wider portions 11b is greater than the duty ratio of the main portions 11a. These upper and lower limits may be combined in any manner.

In a configuration in which each electrode finger 11 includes one main portion 11a and two wider portions 11b as in the illustrated example, the lengths (in the D2 direction) of these portions may be set as appropriate. For example, the length of one wider portion 11b may be greater than or equal to 0.5 p, 0.7 p, or 0.9 p and may be less than or equal to 2 p, 1.5 p, or 1.1 p. These upper and lower limits may be combined in any manner.

The thickness of the IDT electrode 5 (conductor layer) is, for example, generally constant regardless of the position in a planar direction (direction parallel to D1-D2 plane). The thickness of the conductor layer may be set as appropriate in accordance with the characteristics required for the device 1. For example, the thickness of the conductor layer may be greater than or equal to 0.04p and less than or equal to 0.20p, and/or greater than or equal to 50 nm and less than or equal to 600 nm.

The conductor layer is formed using a metal, for example. The metal may be any suitable metal and, for example, may be aluminum (Al) or an alloy having Al as a main component (Al alloy). The Al alloy is, for example, an Al-copper (Cu) alloy. The conductor layer may be composed of multiple metal layers. For example, the conductor layer may be composed of a relatively thin layer of titanium (Ti) stacked on the top surface 3a of the piezoelectric body 3 and an Al or Al alloy stacked on the Ti layer. Ti, for example, contributes to strengthening the bond between the Al or Al alloy and the piezoelectric body 3.

(Intervening Electrodes)

FIG. 2 is an enlarged view of a region II in FIG. 1.

As will be illustrated below, the intervening electrodes 41 can have various specific shapes. In FIG. 2, an intervening electrode 41A according to a first example is illustrated. In descriptions made while referring to FIG. 2 (and drawings similar to FIG. 2), unless specifically noted otherwise and unless any inconsistencies or the like arise, busbar 9, electrode fingers 11 and intervening electrode 41 refer to those that are connected to each other (within one comb electrode 7).

Each intervening electrode 41 is, for example, configured in an overall grid or mesh shape. Specifically, for example, the intervening electrode 41 includes two types of parts, namely, multiple (eight in the illustrated example) bar electrodes 43 and multiple connection portions 45. The multiple bar electrodes 43 extend parallel to the busbar 9 and extend parallel to each other. A region between two adjacent bar electrodes 43 (or adjacent bar electrode 43 and busbar 9) may be referred to as a slit region S1. Each connection portion 45 is positioned in a slit region S1 and connects two adjacent bar electrodes 43 (or adjacent bar electrode 43 and busbar 9) to each other.

At least some (all in the illustrated example) of the multiple connection portions 45 are disposed in a discontinuous manner with respect to the direction in which the electrode fingers 11 extend (D2 direction). That is, at least some of the multiple connection portions 45 are not disposed so as to form a straight line parallel to the D2 direction extending from the busbar 9 to the bar electrode 43 closest to the electrode fingers 11. From another perspective, at least one connection portion 45 at least partially overlaps, in the D2 direction, a conductor (IDT electrode 5) not-disposed region in at least one slit region S1 (for example, in an adjacent slit region S1) other than the slit region S1 in which itself is located.

For example, spurious can be reduced by disposing multiple connection portions 45, in the above-described manner. The applicant has confirmed this effect through actual measurements on test pieces and simulation calculations, and a number of examples will be described below. Some principles that can be used to reduce spurious are described below.

Acoustic waves are reflected at the boundaries between conductor (IDT electrode 5) disposed regions and conductor not-disposed regions. If all the connection portions 45 are disposed to form straight lines parallel to the D2 direction, transverse mode spurious will be reflected by the bar electrode 43 closest to the electrode fingers 11 at the position of the straight line in the D1 direction, and by each of multiple bar electrodes 43 (and busbar 9) at other positions in the D1 direction. That is, the position in the D2 direction where reflection occurs is basically constant regardless of the position in the D1 direction. As a result, the wavelengths as well as the positions of nodes and antinodes of transverse mode spurious components are more likely to be aligned, and thus more likely to reinforce each other.

On the other hand, when multiple connection portions 45 are disposed in a non-continuous manner with respect to the D2 direction as in this embodiment, there are conductor not-disposed regions at positions overlapping the connection portions 45 in the D2 direction. Transverse mode spurious is also reflected between these not-disposed regions and the bar electrodes 43. Depending on the shape of the connection portions 45, reflection may also occur at the connection portions 45. The positions of these new reflections are distributed in the D1 direction and the D2 direction. As a result, the wavelengths and positions of nodes and antinodes of the transverse mode spurious components are dispersed, and this in turn reduces mutual reinforcement of the components.

As is clear from the above principles, the number, shape, position, dimensions, and so on of the multiple bar electrodes 43 and the multiple connection portions 45 may be chosen as appropriate, as long as the multiple connection portions 45 are disposed in a discontinuous manner in the D2 direction. For example, this is described in more detail below.

The number of bar electrodes 43 may be any number of two or more. When two bar electrodes 43 are provided, two slit regions S1 are formed by the two bar electrodes 43 and the corresponding busbar 9. In turn, at least two connection portions 45 positioned in different slit regions S1 can be disposed in a discontinuous manner with respect to the D2 direction.

The multiple bar electrodes 43 have the same shape and dimensions as each other, for example. Each bar electrode 43 is roughly shaped so as to extend in a straight line with a constant width. From another perspective, the shape of the edges or centerline of each bar electrode 43 is the same as the shape of the edge of the busbar 9 on the side near the electrode fingers 11 and/or the shape of a line connecting the tips of the electrode fingers 11 facing the intervening electrode 41 across the gaps G1 (the tips of the electrode fingers 11 of the comb electrode 7 that meshes with the comb electrode 7 to which the bar electrode 43 being focused on belongs).

In contrast to the above illustrated example, just to be clear, unlike in the illustrated example, at least one bar electrode 43 may have a shape and/or dimensions that are different from those of another at least one bar electrode 43. The bar electrodes 43 may vary in width (in the D2 direction) depending on the position in the D1 direction. The centerline and/or edges of the bar electrode 43 may be curved or have a shape consisting of multiple intersecting straight lines. The shape of the centerline and/or edges of the bar electrodes 43 may be different from the shape of the edge of the busbar 9 on the side near the electrode fingers 11 and/or the shape of a line connecting the tips of the electrode fingers 11 facing the intervening electrode 41 across the gaps G1.

The length of the bar electrodes 43 (in the D1 direction) may be roughly equivalent to the length of the busbars 9. The width of the bar electrodes 43 may be, for example, smaller than (illustrated example), equal to, or larger than the width of the busbar 9 (in the D2 direction) and/or the electrode fingers 11 (in the D1 direction). In addition, for example, the width of the bar electrodes 43 may be greater than or equal to 0.1p or 0.2p, and may be less than or equal to 0.5p or 0.3p. These lower and upper limits may be combined in any manner.

As already mentioned, the multiple bar electrodes 43 extend parallel to the busbar 9 and parallel to each other. More particularly, in the illustrated example, the multiple bar electrodes 43 (for example, the centerlines, the same applies hereinafter) and the edge of the busbar 9 on the side near the electrode fingers 11 extend parallel to each other. From another perspective, the distances between these members in the D2 direction (the direction of extension of the electrode fingers 11) are constant regardless of the position in the D1 direction (the acoustic wave propagation direction). The direction in which the multiple bar electrodes 43 (and busbars 9) extend is, for example, the D1 direction.

Unlike in the illustrated example, part or all of at least one bar electrode 43 may be inclined with respect to the busbar 9, another at least one bar electrode 43, and/or the D1 direction. As a result, the bar electrode 43 may include a part that intersects the busbar 9 and/or another bar electrode 43. However, in this case, a portion of the intersecting part may be considered to be a type of connection portion 45, and the multiple bar electrodes 43 may be considered as not intersecting.

The pitches of the multiple bar electrodes 43 (for example, the distance between the centers of two adjacent bar electrodes 43) are, for example, identical to each other. However, at least one pitch may be different from another pitch. The pitch of the bar electrodes 43 may be smaller than (illustrated example), equal to, or larger than the pitch p of the electrode fingers 11. The pitch of the bar electrodes 43 may be, for example, greater than or equal to 0.2p or 0.4p, and may be less than or equal to 1p or 0.6p. These lower and upper limits may be combined in any manner.

The widths of the multiple slit regions S1 (in the D2 direction) are identical to each other, for example. However, at least one width may be different from another width. The width of the slit regions S1 may be smaller than (illustrated example), equal to, or larger than the pitch p of the electrode fingers 11. For example, the width of the slit regions S1 may be greater than or equal to 0.1p or 0.2p and may be less than or equal to 0.5p or 0.3p. These lower and upper limits may be combined in any manner.

The ratio of the width of the bar electrodes 43 to the pitch of the bar electrodes 43 (the latter divided by the former; the duty ratio) may be smaller than, equal to, or greater than the duty ratio of the electrode fingers 11, for example. For example, the duty ratio of the bar electrodes 43 may be greater than or equal to 0.1 or 0.4, and less than or equal to 0.8 or 0.6. These lower and upper limits may be combined in any manner.

The shape and dimensions of the multiple connection portions 45 are identical to each other, for example. The discontinuous arrangement of the multiple connection portions 45 with respect to the D2 direction is realized due to the positions of the multiple connection portions 45 (For example, the positions of the geometric centers. Unless particularly noted otherwise, the same applies hereinafter.) not being located on straight lines parallel to the D2 direction (i.e., are displaced from each other in the D1 direction). However, unlike in the illustrated example, the shapes and dimensions of the multiple connection portions 45 may be different from each other. In this case, in addition to or instead of there being shifts in position in the D1 direction, the discontinuous arrangement with respect to the D2 direction may be realized by differences in the shapes and/or dimensions of the multiple connection portions 45.

Figure 4A:
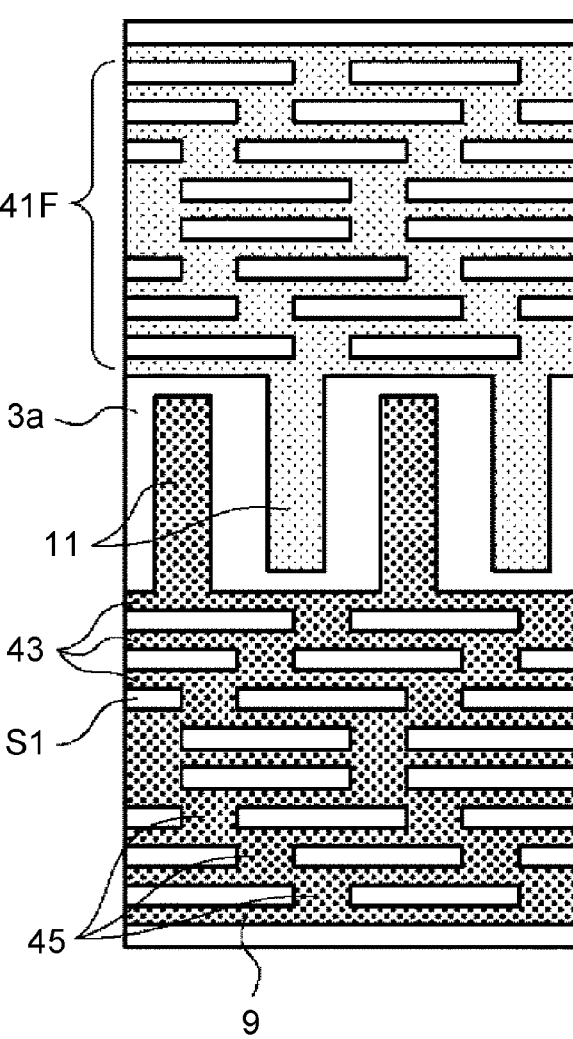
FIG. 4A is a diagram illustrating yet another specific example (sixth example) of an IDT electrode.
Figure 5:
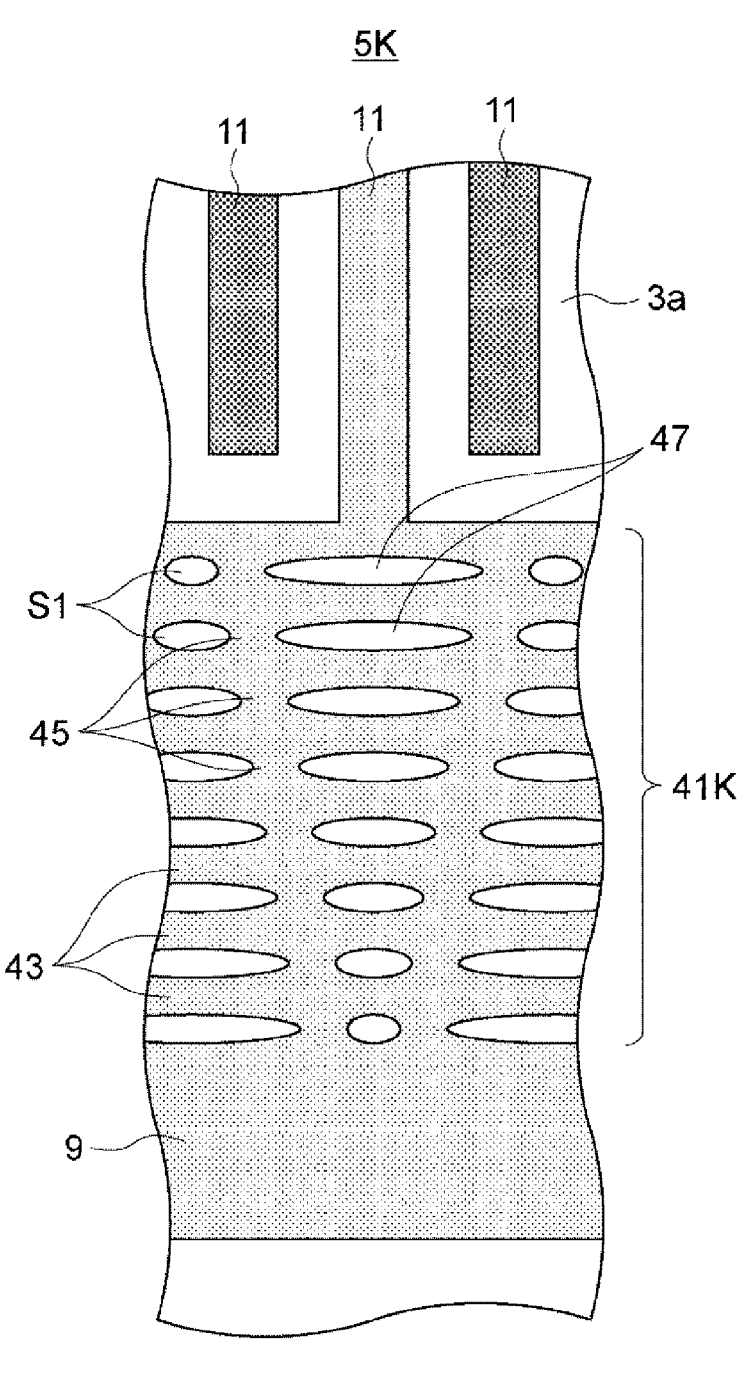
FIG. 5 is a diagram illustrating yet another specific example (eleventh example) of an IDT electrode.
Figure 5:
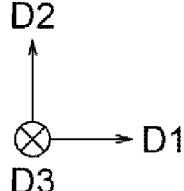

The shape of the connection portions 45, for example, may be a rectangle with four sides parallel to the D1 and D2 directions (refer to FIG. 4A), or a parallelogram with two sides parallel to the D1 direction (example in FIG. 2), or neither of these shapes (refer to FIG. 5). The length of the connection portions 45 in the D2 direction is equal to the width of the slit regions S1, and this width has been previously described. The length of the connection portions 45 in the D1 direction may be set as appropriate. For example, the length of the connection portions 45 in the D1 direction may be smaller than, equal to, or larger than the length of the connection portions 45 in the D2 direction. For example, the length of the connection portions 45 in the D1 direction may be greater than or equal to 0.1p, 0.3p, or 0.5p, and may be less than or equal to 1p, 0.8p, or 0.7p. These lower and upper limits may be combined in any manner.

Various Specific Examples of IDT Electrode (Particularly Intervening Electrodes)

FIGS. 3A to 5 illustrate other specific examples of the IDT electrode 5 (particularly the intervening electrodes 41). FIGS. 3A to 3D and FIG. 5 illustrate a range corresponding to the region II in FIG. 1 similarly to FIG. 2. FIGS. 4A to 4E illustrate a partial range in the D1 direction of a pair of comb electrodes 7. In FIG. 3A to FIG. 4E, illustration of the Cartesian coordinate system D1-D2-D3 is omitted, but similarly to as in FIG. 2, the left-right direction in the figures is the D1 direction and the up-down direction in the figures is the D2 direction.

The various specific examples illustrated in these figures mainly differ from one another in terms of the arrangement of the multiple connection portions 45. Each specific example is described below, starting with FIG. 2. Note that after the description of an IDT electrode 5A (intervening electrode 41A) illustrated in FIG. 2, basically, the differences from the IDT electrodes 5 described previously will be described. Matters that are not specifically mentioned may be considered to be the same as the IDT electrode 5 described earlier, or may be inferred from the IDT electrodes 5 described earlier. For convenience, the same symbols may be used for the corresponding parts of multiple specific examples even if the corresponding parts have different shapes from each other.

First Example of IDT Electrode

In the IDT electrode 5A (intervening electrode 41A) illustrated in FIG. 2, the multiple connection portions 45 are disposed so as to form straight lines that are inclined with respect to the D2 direction. The straight lines extend, for example, from the busbar 9 to the bar electrode 43 closest to the electrode fingers 11. Focusing on two straight lines that are adjacent to each other in the D1 direction, the multiple connection portions 45 are arranged in a V-shape that closes (or opens) toward the side where the electrode fingers 11 are located. In the illustrated example, multiple V-shapes are arranged so as to be connected to each other in the D1 direction. In other words, the multiple connection portions 45 are arranged in a zigzagging line extending in the D1 direction. Note that, unlike in the illustrated example, one V may be positioned at a specific location in the D1 direction, or adjacent V's may be separated from each other.

In the example in FIG. 2, in the slit region S1 closest to the electrode fingers 11, two connection portions 45 on two straight lines are connected to each other, or one connection portion 45 is shared by two straight lines. On the other hand, in the slit region S1 closest to the busbar 9, two connection portions 45 on two straight lines are separated from each other. However, unlike in the illustrated example, in the slit region S1 closest to the electrode fingers 11, the two connection portions 45 on two straight lines may be separated from each other. In the slit region S1 closest to the busbar 9, the two connection portions 45 on two straight lines may be connected to each other (shared by two straight lines).

Note that even in the case where the two connection portions 45 on two straight lines in the slit region S1 closest to the electrode fingers 11 are spaced apart from each other, as long as the distance between the two connection portions 45 is not too large, a closed V-shape may be considered to be formed on the side near the electrode fingers 11. For example, if the size of the gap between the two connection portions 45 closest to the electrode fingers 11 (or the distance between the geometric centers) is less than or equal to 1.5p, 1.0p, or 0.7p, a closed V-shape may be considered to be formed on side near the electrode fingers 11. The same also applies to a case where a closed V-shape is considered to be formed on the side near the busbar 9. The same also applies to a case in which multiple V-shapes are repeatedly arranged in the D1 direction and are considered to be connected to each other.

In a case in which multiple connection portions 45 are arranged along straight lines (or curved lines) inclined with respect to the D2 direction, the positions in the D1 direction of the connection portions 45 located closest to the electrode fingers 11 and the connection portions 45 located closest to the busbar 9 may be set as appropriate. For example, the connection portions 45 located closest to the electrode fingers 11 may be located at the positions, in the D1 direction, of the electrode fingers 11 of the comb electrode 7 to which the connection portions 45 belong (see the center in the left-right direction in FIG. 3A), at positions in the D1 direction of the electrode fingers 11 of the other comb electrode 7 (example in FIG. 2), or at any positions between the former positions and the latter positions. The same applies to the connection portions 45 located closest to the busbar 9.

In a case in which the multiple connection portions 45 are arranged along straight lines (or curved lines) that are inclined with respect to the D2 direction, the angle of inclination of the straight lines may be set as appropriate. From another perspective, the size of the V-shape in the D1 direction may be set as appropriate. From yet another perspective, the distance (relative positions) in the D1 direction between the connection portions 45 located closest to the electrode fingers 11 and the connection portions 45 located closest to the busbar 9 on the straight lines above may be set as appropriate. From yet another perspective, the pitch at which the multiple V-shapes are arranged may be set as appropriate.

For example, let us consider the range over which a straight line or V-shape is disposed in the D1 direction with reference to a line connecting the geometric centers of multiple connection portions 45 arranged along a straight (or curved) line (the same applies when describing the range over which a straight line or V-shape is disposed in other specific examples). The range over which one straight line is disposed in the D1 direction may be greater than or equal to 0.1p or 0.2p, and may be less than or equal to 2.0p, 1.5p, or 1.2p. These lower and upper limits may be combined in any manner. In the example in FIG. 2, the range over which one straight line is disposed in the D1 direction is generally 1p (for example, greater than or equal to 0.8p and less than or equal to 1.2p). From another perspective, in the example in FIG. 2, the range in the D1 direction over which a V-shape is disposed is generally 2p (for example, greater than or equal to 1.8p and less than or equal to 2.2p).

Let us focus on the −D1 or +D1-side edges of the multiple connection portions 45 arranged on straight (or curved) line. In this case, the edges are positioned on the same straight line inclined with respect to the D1 direction (or on the same curved line), for example (not in a staircase like manner as in FIG. 4C). In other words, the −D1 and/or +D-side edges of the multiple connection portions 45 are configured as though the edges are smoothly connected to each other (strictly speaking, the bar electrodes 43 are interposed.). In any of the arrangements of the multiple connection portions 45 in a V-shape or other shapes, the −D1 and/or +D-side edges may be or not be configured as though the edges are smoothly connected to each other.

Figure 4B:
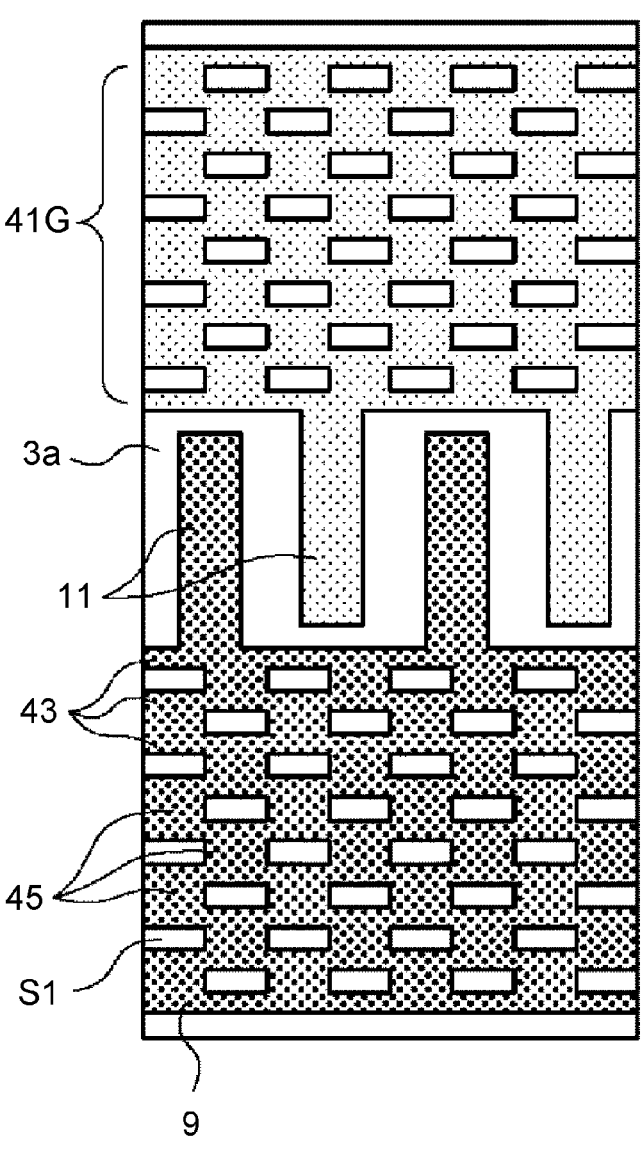
FIG. 4B is a diagram illustrating yet another specific example (seventh example) of an IDT electrode.
Figure 4C:
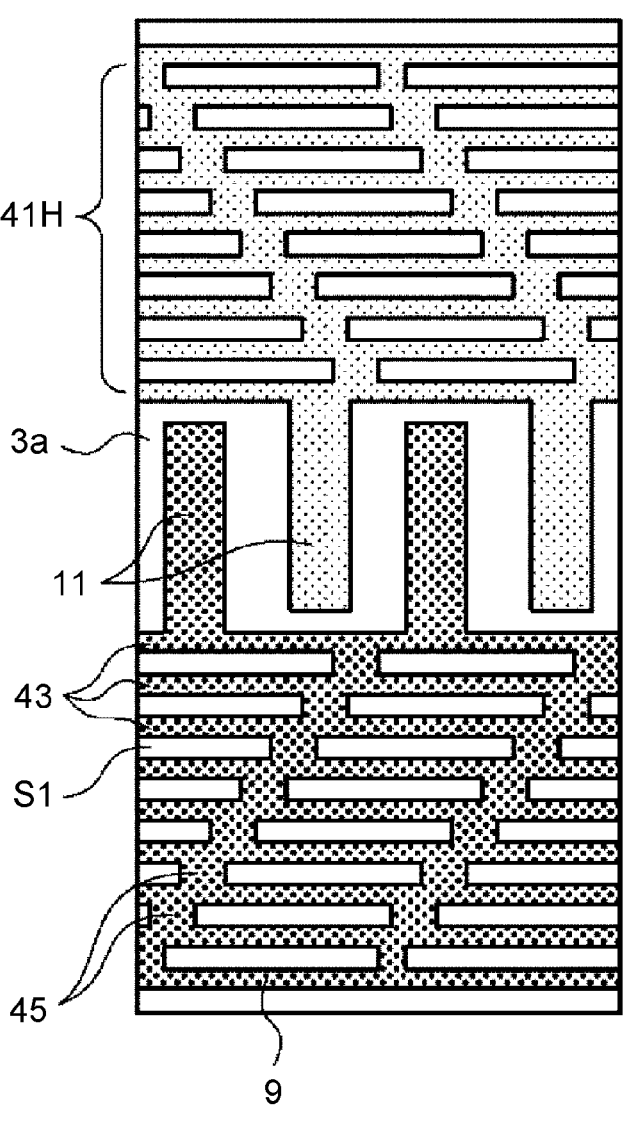
FIG. 4C is a diagram illustrating yet another specific example (eighth example) of an IDT electrode.
Figure 4D:
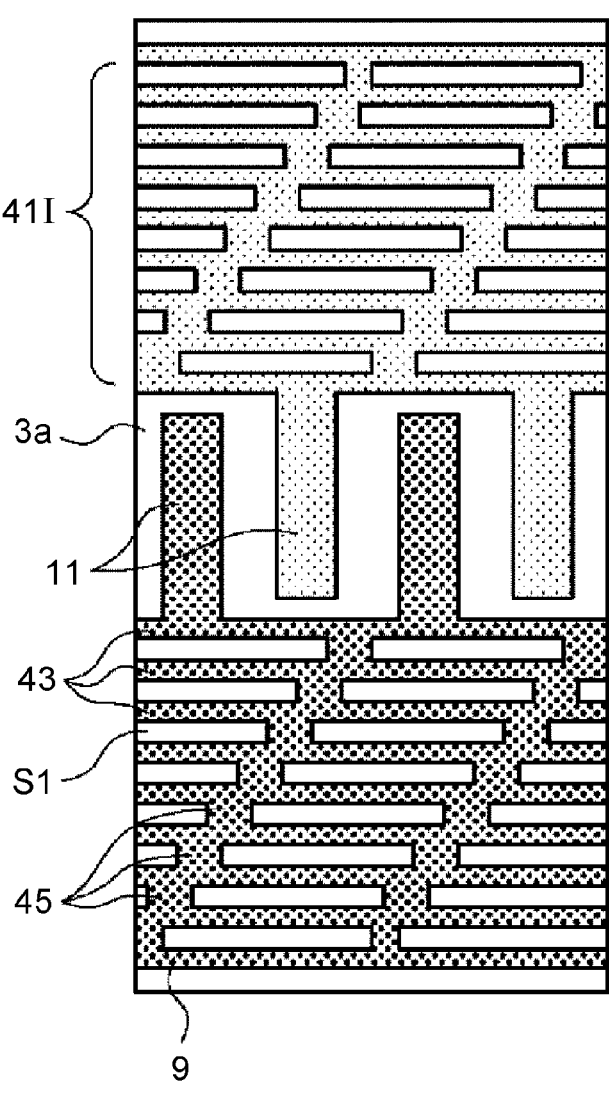
FIG. 4D is a diagram illustrating yet another specific example (ninth example) of the IDT electrode.
Figure 4E:
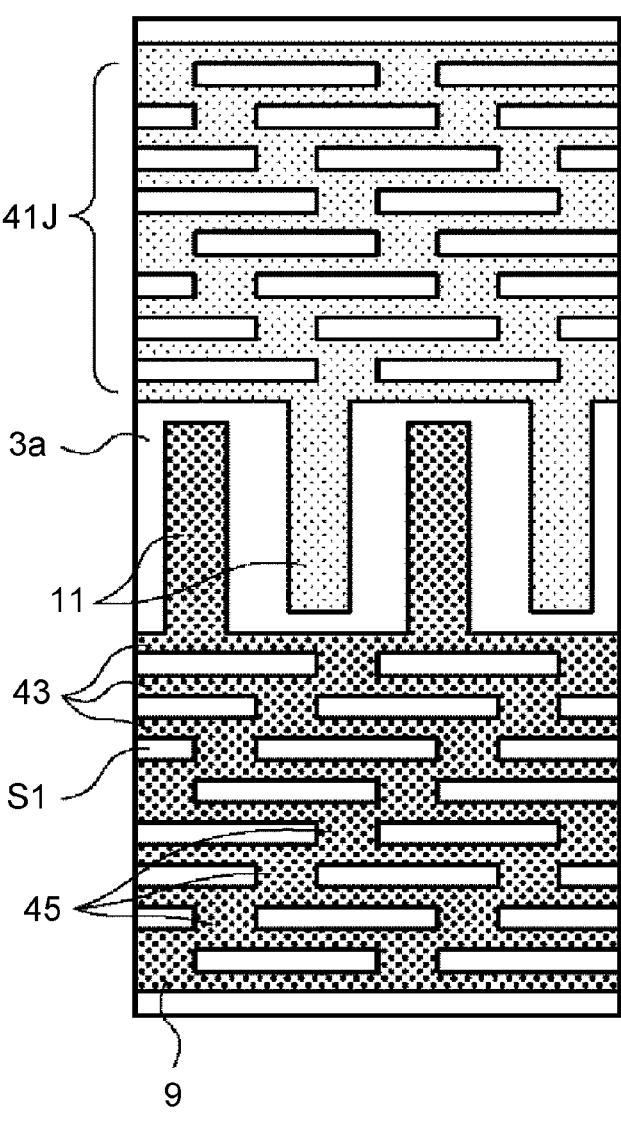
FIG. 4E is a diagram illustrating yet another specific example (tenth example) of an IDT electrode.

In multiple connection portions 45 arranged on a straight (or curved) line, adjacent connection portions 45 may overlap each other in the D2 direction (example in FIG. 2) or not overlap each other in the D2 direction (see FIGS. 4A and 4E). The amount of overlap in the former case may be set as appropriate and may be smaller than, equal to, or greater than half the length in the D1 direction of one connection portion 45, for example. The distance between two connection portions 45 in the latter case may be set as appropriate, for example, the distance may be 0 (examples in FIGS. 4A and 4E) or greater than 0.

Second Example of IDT Electrode

Figure 3A:
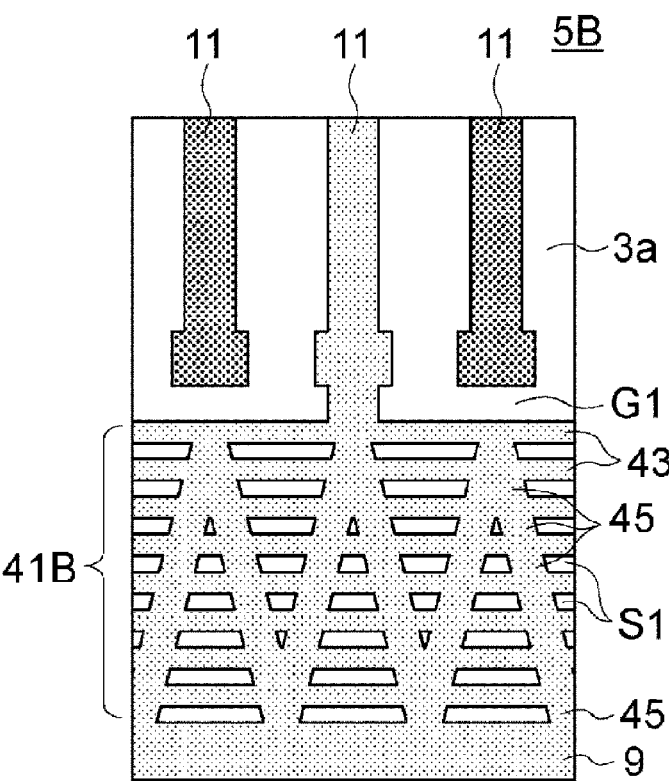
FIG. 3A is a diagram illustrating another specific example (second example) of an IDT electrode.

An intervening electrode 41B (IDT electrode 5B) illustrated in FIG. 3A includes multiple connection portions 45 arranged in V-shapes, similarly to the intervening electrode 41A in FIG. 2. However, in the intervening electrode 41B, the size of the V-shapes in the D1 direction is smaller than that in the intervening electrode 41A. From another perspective, the number of repeatedly arranged V-shapes is greater in the range of a prescribed length in the D1 direction. Specifically, in the intervening electrode 41B, the range over which one straight line is disposed in the D1 direction is generally 0.5p (for example, greater than or equal to 0.3p and less than or equal to 0.7p). From another perspective, in the example of FIG. 3A, the range over which a V-shape is disposed in the D1 direction is generally 1p (for example, greater than or equal to 0.8p and less than or equal to 1.2p).

Third Example of IDT Electrode

Figure 3B:
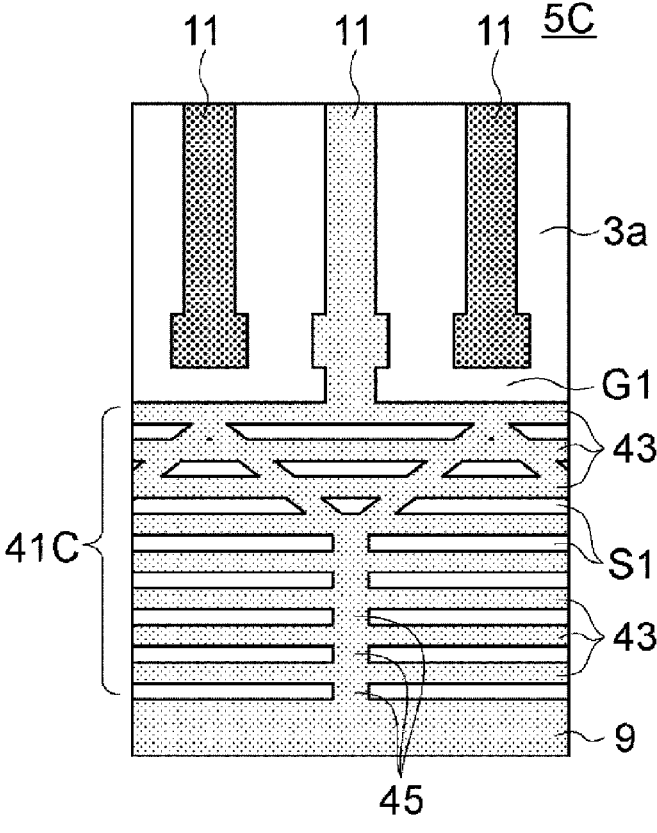
FIG. 3B is a diagram illustrating yet another specific example (third example) of an IDT electrode.

In an intervening electrode 41C (IDT electrode 5C) illustrated in FIG. 3B, multiple connection portions 45 are disposed in a Y-shape that opens toward the side near the electrode fingers 11. As illustrated in this example, the multiple connection portions 45 may include two or more connection portions 45 arranged in a straight line parallel to the D2 direction. With respect to the intervening electrode 41C, multiple (fewer than the number of slit regions S1) connection portions 45 positioned on the side near the electrode fingers 11 may be considered to be disposed in a V-shape that opens towards the side near the electrode fingers 11. Therefore, the description of the V-shape in the intervening electrode 41A may be applied to the V-shape in the Y-shape of the intervening electrode 41C, as appropriate. The ratio of the number of slit regions S1 constituting the V-shaped portion of the Y-shape to the number of slit regions S1 constituting the I-shaped portion of the Y-shape may be chosen as appropriate.

Fourth Example of IDT Electrode

Figure 3C:
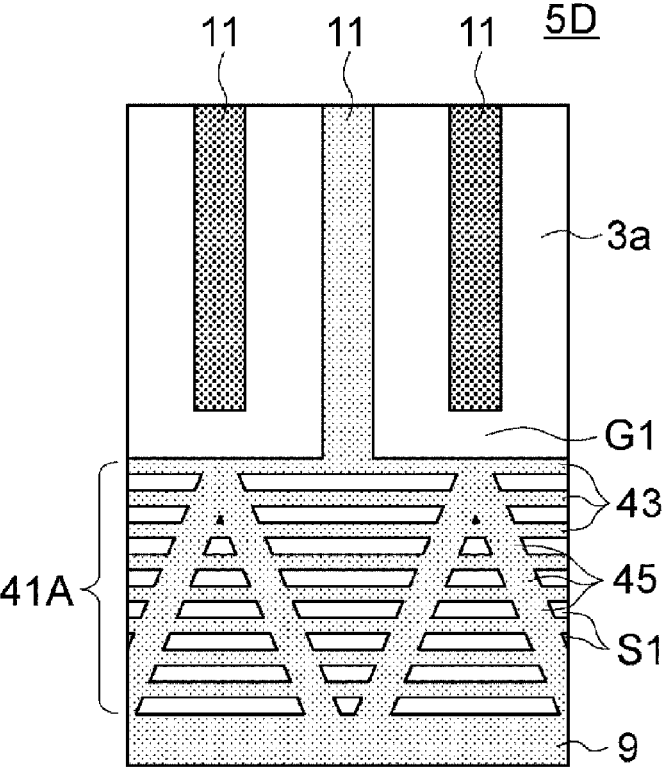
FIG. 3C is a diagram illustrating yet another specific example (fourth example) of an IDT electrode.

In the IDT electrode 5C illustrated in FIG. 3C, the multiple electrode fingers 11 extend through their entire length with a constant width. In the example of FIG. 3C, the intervening electrode 41A of FIG. 2 is illustrated as the intervening electrode 41. However, the electrode fingers 11, which extend at a constant width along their entire length, may be combined with another specific example of the intervening electrode 41. Similarly, the electrode fingers 11 including wider portions 11b may be combined with any of the specific examples of the intervening electrode 41.

Fifth Example of IDT Electrode

Figure 3D:
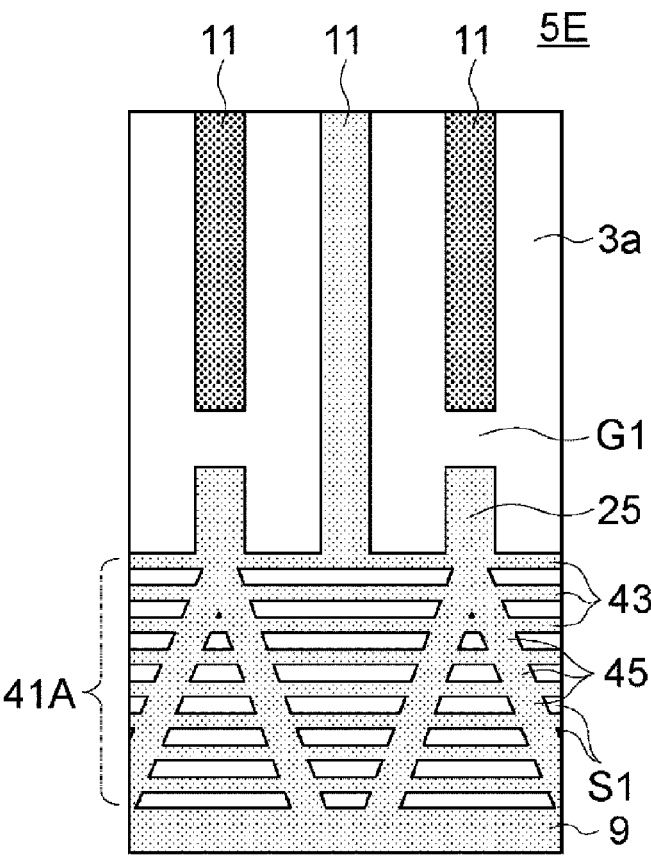
FIG. 3D is a diagram illustrating yet another specific example (fifth example) of the IDT electrode.

An IDT electrode 5E illustrated in FIG. 3D includes so-called dummy electrodes 25. The multiple dummy electrodes 25 extend from the intervening electrode 41 (more specifically, the bar electrode 43 closest to the electrode fingers 11) in parallel with the multiple electrode fingers 11. The tips of the dummy electrodes 25 of one comb electrode 7 face the tips of the electrode fingers 11 of the other comb electrode 7 across the gaps G1.

The shape of the dummy electrodes 25 may be chosen as appropriate. In the illustrated example, the dummy electrodes 25 are roughly shaped so as to have a constant width and protrude in a direction perpendicular to the acoustic wave propagation direction. In the illustrated example, the width of the dummy electrodes 25 is the same as the width of the electrode fingers 11 without the wider portions 11b (or the width of the main portions 11a of the electrode fingers 11 with the wider portions 11b).

Unlike in the illustrated example, the width of the dummy electrodes 25 may be larger in part of the dummy electrodes 25 on the side near the gap G1 and/or the side near the busbar 9. The combination of electrode fingers 11 and dummy electrodes 25 having or not having wider portions may be chosen as appropriate. For example, in addition to the illustrated example, a combination of electrode fingers 11 with wider portions and dummy electrode 25 without wider portions, a combination of electrode fingers 11 with wider portions and dummy electrodes 25 with wider portions, or a combination of electrode fingers 11 without wider portions and dummy electrodes 25 with wider portions may be employed. In the combination of electrode fingers 11 with wider portions and dummy electrodes 25 without wider portions, the width of the dummy electrodes 25 may be equal to the width of the main portions 11a or the width of the wider portions 11b, for example.

In the example of FIG. 3D, the intervening electrode 41A of FIG. 2 is illustrated as the intervening electrode 41. However, the dummy electrodes 25 may be used in combination with other specific examples of the intervening electrode 41. Similarly, a configuration without the dummy electrodes 25 may be applied to any of the specific examples of the intervening electrode 41.

Sixth Example of IDT Electrode

In an intervening electrode 41F (IDT electrode 5F) illustrated in FIG. 4A, the multiple connection portions 45 are arranged in straight lines inclined with respect to the D2 direction, similarly to the intervening electrode 41A in FIG. 2. However, the multiple connection portions 45 are arranged in a V-shape that opens toward one side in the D1 direction (right side in FIG. 4A), instead of a V-shape that opens toward the side near the electrode fingers 11. From another perspective, the multiple connection portions 45 are arranged along two straight lines that are inclined toward opposite sides with respect to the D2 direction and intersect each other. The direction in which the V-shape opens may be the same (illustrated example) or different for the pair of comb electrodes 7. Although not specifically illustrated, multiple connection portions 45 may be disposed along three or more straight lines (a zigzag path) that intersect consecutively. Two connection portions 45 are positioned at the positions where the straight lines intersect, but just one connection portion 45 may instead be positioned.

The lengths and/or inclination angles of the two (or more) straight lines constituted by the multiple connection portions 45 may be equal to each other (illustrated example) or different from each other. As mentioned in the description of the intervening electrode 41A, the −D1 or +D1-side edges of multiple connection portions 45 arranged in a straight line may be positioned on the same straight line (smoothly connected) or not be positioned on the same straight line. In the example in FIG. 4A, the latter configuration is employed, and the edges of the multiple connection portions 45 form a staircase-like shape. As mentioned in the description of the intervening electrode 41A, in the multiple connection portions 45 arranged in a straight line, the connection portions 45 adjacent to each other may partially overlap each other in the D2 direction or not overlap each other. In the example of FIG. 4A, the latter is the case, more precisely, the connection portions 45 that are adjacent to each other are adjacent to each other when projected in the D1 direction (the distance between them is zero).

Seventh Example of IDT Electrode

In an intervening electrode 41G (IDT electrode 5G) illustrated in FIG. 4B, multiple connection portions 45 are disposed in a checkerboard pattern. From another perspective, the multiple connection portions 45 are disposed in multiple parallel straight lines inclined with respect to the D2 direction, and the multiple straight lines partially overlap in the D2 direction.

Eighth Example of IDT Electrode

In an intervening electrode 41H (IDT electrode 5H) illustrated in FIG. 4C, the multiple connection portions 45 are disposed in multiple parallel straight lines that are inclined with respect to the D2 direction. However, unlike in FIG. 4B, the multiple straight lines are disposed over different ranges in the D1 direction and do not overlap each other in the D2 direction.

Ninth Example of IDT Electrode

An intervening electrode 41I (IDT electrode 5I) illustrated in FIG. 4D has generally the same configuration as the intervening electrode 41H in FIG. 4C. In other words, the multiple connection portions 45 are disposed in multiple parallel straight lines that are inclined with respect to the D2 direction (the direction in which the electrode fingers 11 extend). However, in FIG. 4C, the straight lines in one comb electrode 7 and the straight lines in the other comb electrode 7 are inclined toward opposite sides with respect to the D2 direction, whereas in FIG. 4D, the straight lines in one comb electrode 7 and the straight lines in the other comb electrode 7 are inclined toward the same side.

Tenth Example of IDT Electrode

An intervening electrode 41J (IDT electrode 5J) illustrated in FIG. 4E has generally the same configuration as the intervening electrode 41H in FIG. 4C. In other words, the multiple connection portions 45 are disposed in multiple parallel straight lines that are inclined with respect to the D2 direction (the direction in which the electrode fingers 11 extend). However, unlike the intervening electrode 41H, the multiple straight lines in the intervening electrode 41J partially overlap each other in the D2 direction by amounts that do not result in a checkerboard pattern (see intervening electrode 41G in FIG. 4B).

Eleventh Example of IDT Electrode

In an intervening electrode 41K (IDT electrode 5K) illustrated in FIG. 5, regions surrounded by connection portions 45 that are adjacent to each other in the slit regions S1 and the bar electrodes 43 on both sides of the slit regions S1 (regions where the conductor is not disposed) are referred to as opening regions 47. The shape of at least one (all in the illustrated example) of the multiple opening regions 47 is an elliptical shape. The term elliptical shape used here does not need to be an ellipse as defined by mathematics. For example, if the edges on both sides in the D1 direction are curved and bulge outward, the shape may be considered elliptical. Typically, an ellipse is, for example, a circular shape that has been squashed in the D2 direction. Circles may also be included in the term elliptical shape. A rectangular shape in which the shorter sides bulge outward in a curved manner may also be included in the term elliptical shape used here. Here, similarly to the intervening electrode 41A in FIG. 2, a configuration in which multiple connection portions 45 are disposed in a V-shape is taken as an example. However, the ellipse-shaped opening regions 47 may be applied to other configurations.

(Other Matters)

The multiple connection portions 45 may be disposed in various arrangements other than those of the illustrated examples. For example, multiple connection portions 45 may be disposed in an X-shape. As already mentioned, multiple connection portions 45 may be arranged along a curved line.

(Velocity Profile)

Let us return to FIG. 1. In plan view of the top surface 3a of the piezoelectric body 3, the region where the IDT electrode 5 is disposed can be divided into the following four types of regions in the D2 direction based on the configuration of the IDT electrode 5. The crossing region R0 in which the multiple first electrode fingers (electrode fingers 11 of one comb electrode 7) and the multiple second electrode fingers (electrode fingers 11 of other comb electrode 7) overlap in the acoustic wave propagation direction. Gap regions RG in which the gaps G1 are positioned. Intervening regions RI in which the intervening electrodes 41 are positioned. Busbar regions RB in which the busbars 9 are positioned.

The crossing region R0 may be regarded as a region that is interposed between a line (not illustrated) connecting the tips of the electrode fingers 11 of one comb electrode 7 and a line (not illustrated) connecting the tips of the electrode fingers 11 of the other comb electrode 7. If the positions of the above lines and so on differ depending on what position within the width of the electrode fingers 11 is used as a reference when assuming lines connecting prescribed parts (for example, the tips) of the multiple electrode fingers 11, the center lines of the electrode fingers 11 may be used as a reference.

In the illustrated example, the crossing region R0 can be divided into two types of (three) regions in the D2 direction based on the width of the electrode fingers 11. A central region RC where multiple main portions 11a overlap in the D1 direction. Edge regions RE where multiple wider portions 11b overlap in the D2 direction. For the widths of these regions (in the D2 direction), refer to the description of the main portions 11a and the wider portions 11b.

These multiple regions have different acoustic velocities from each other. The term "acoustic velocity" used here may be, for example, the velocity at which the acoustic waves of the mode utilized by the device 1 propagate through the piezoelectric body 3. However, normally, when multiple regions are defined based on the shape of the IDT electrode 5 and so on, the relationship between high and low acoustic velocities in the multiple regions is not reversed depending on the difference in the specific mode of the acoustic waves utilized. Therefore, there is no need to identify which mode the acoustic velocity of the acoustic waves correspond to when considering the relationship between high and low acoustic velocities, which is discussed below.

The acoustic velocity of the acoustic waves is affected by the mass of a member (for example, the IDT electrode 5) positioned on the top surface 3a of the piezoelectric body 3. For example, in each region, the greater the mass per unit area, the lower the acoustic velocity. On the other hand, if the thickness of the conductor layer constituting the IDT electrode 5 is constant, the larger the ratio of the area of the conductor layer to the unit area, the larger the mass per unit area. Therefore, the acoustic velocity is lower in regions where the area percentage of the conductor layer constituting the IDT electrode 5 is larger.

Therefore, in the illustrated example, the names of the region from the one with the lowest acoustic velocity are, for example, the busbar region RB, the crossing region R0, and the gap region RG. In addition, in the crossing region R0, the edge regions RE have a lower acoustic velocity than the central region RC. The acoustic velocity of the intervening regions RI is higher than the acoustic velocity of the busbar regions RB. The acoustic velocity of the intervening regions RI may be lower than, equal to, or higher than the acoustic velocities of the crossing region R0 and the gap regions RG. For example, the acoustic velocity of the intervening regions RI is lower than the acoustic velocity of the gap regions RG and the acoustic velocity of the central region RC (or the crossing region R0 in a case where the electrode fingers 11 have a constant width along their entire length).

Although not specifically illustrated, the acoustic velocity in the crossing region R0 may vary in three or more steps instead of two steps. For example, the central region RC may include two or more types of regions with different acoustic velocities from each other. The same applies to the edge regions RE. The changes in acoustic velocity with position in the D2 direction may be continuous rather than step like. The velocity profile described above (the relationship between high and low velocities between regions) may be achieved by methods other than the ratio of the area of the conductor layer to the unit area. For example, an additional film (described below) may be provided that partially overlaps the top surface or the bottom surface of the IDT electrode 5, thereby reducing the velocity in the region where the additional film is provided. Regions of the conductor layer constituting the IDT electrode 5 may be made thicker so as to reduce the velocity in the regions that have been made thicker. An insulating film may be provided at appropriate positions regardless of the regions where the conductor constituting the IDT electrode 5 is disposed or not disposed in order to lower the velocity in the regions where the insulating film is provided.

Various Example Configurations of Substrates Including Piezoelectric Body

The piezoelectric body 3 having the top surface 3a on which the IDT electrode 5 is formed may constitute part of or the entirety of a substrate, for example. The substrate may have any of various configurations, for example, may have a known configuration. Hereafter, examples of the configuration of the substrate are described.

FIG. 6 is a sectional view illustrating the configuration of a substrate 13A as a first example of a substrate. The illustrated cross section corresponds to a cross section taken along line VI-VI in FIG. 1.

The substrate 13A includes, for example, a support substrate 15, an intermediate layer 17 stacked on the top surface of the support substrate 15, and a piezoelectric body 3 stacked on the top surface of the intermediate layer 17. Here, the piezoelectric body 3 consists of a piezoelectric film. In the description of the configuration of the acoustic wave device, the words "plate", "layer", and "film" are assumed to have the same meaning, unless stated otherwise. The thickness of each layer is constant, for example, regardless of the position in planar directions (directions parallel to the D1-D2 plane).

The piezoelectric body 3 is composed of, for example, a single crystal having piezoelectric properties. For example, lithium tantalate ($LiTaO_3$, hereinafter may be abbreviated as LT), lithium niobate ($LiNbO_3$, hereinafter may be abbreviated as LN), and quartz ($SiO_2$) are examples of a material constituting such a single crystal. The piezoelectric body 3 may be composed of a polycrystalline material. The cut angle, planar shape, and various dimensions of the piezoelectric body 3 may be set as appropriate. For example, a piezoelectric body composed of LT or LN may be composed of a rotated Y-cut X-propagation crystal. In other words, the acoustic wave propagation direction (D1 direction) and the X-axis may substantially coincide with each other (for example, the difference therebetween may be ±10°. The inclination angle of the Y axis to a normal (D3 direction) to the top surface 3a of the piezoelectric body 3 may be set as appropriate. The thickness of the piezoelectric body 3 may be, for example, greater than or equal to 0.1p or 0.3p and less than or equal to 2p or 1p. An appropriate combination of these upper and lower limits may be used.

The support substrate 15 may, for example, contribute to at least one of the following: increasing the strength of the substrate 13A, compensating for changes in properties caused by changes in temperature (temperature compensation), and confining acoustic waves to the piezoelectric body 3. Increased strength may be achieved, for example, by appropriately setting the thickness of the support substrate 15, which is composed of a material having a certain degree of strength. Temperature compensation may be achieved by, for example, setting the coefficient of linear expansion of the support substrate 15 to be smaller than that of the piezoelectric body 3. Confinement of acoustic waves may be achieved by, for example, making the acoustic velocity of the support substrate 15 higher than that of the piezoelectric body 3 (and/or the intermediate layer 17) and/or by making the acoustic impedance of the support substrate 15 different from that of the intermediate layer 17.

The material and thickness of the support substrate 15 may be set as appropriate in light of the above objectives. For example, the material of the support substrate 15 may be a semiconductor such as silicon (Si), a single crystal such as sapphire ($Al_2O_3$), or a ceramic such as sintered aluminum oxide ($Al_2O_3$). The thickness of the support substrate 15 is, for example, greater than or equal to 1p or 3p. The thickness of the support substrate 15 is, for example, greater than the thickness of the piezoelectric body 3.

The intermediate layer 17 may, for example, contribute to at least one of the following: increasing the bonding strength between the piezoelectric body 3 and the support substrate 15, and confining acoustic waves to the piezoelectric body 3. Increased bonding strength may be achieved by, for example, selecting a material for the intermediate layer 17 that has relatively high bonding strength with the piezoelectric body 3 and the support substrate 15 when using a prescribed bonding technique. Confinement of acoustic waves may be achieved, for example, by making the acoustic velocity of the intermediate layer 17 lower than that of the piezoelectric body 3 (and/or support substrate 15) and/or by making the acoustic impedance of the intermediate layer 17 different from that of the piezoelectric body 3 (and/or support substrate 15).

The material and thickness of the intermediate layer 17 may be set as appropriate in light of the above objectives. For example, the material of the intermediate layer 17 may be silicon oxide ($SiO_2$). The thickness of the intermediate layer 17 may be, for example, greater than or equal to 0.01p, or 0.1p, and may be less than or equal to 2p, 1p, or 0.5p. An appropriate combination of these upper and lower limits may be used. The thickness of the intermediate layer 17 is smaller than the thickness of the support substrate 15, for example. The thickness of the intermediate layer 17 may be smaller than, equal to, or greater than the thickness of the piezoelectric body 3.

As described above, the intermediate layer 17 may be a low acoustic velocity layer having a lower acoustic velocity than the piezoelectric body 3, and the support substrate 3 may be a high acoustic velocity layer having a higher acoustic velocity than the piezoelectric body 15. In this way, for example, leaking of acoustic waves from the piezoelectric body 3 can be reduced.

The term "acoustic velocity" used here may be, for example, the transverse acoustic velocity determined by the physical properties of each material. In other words, unlike the acoustic velocity mentioned in the velocity profile in the region where the IDT electrode 5 is disposed, the effect of the IDT electrode 5 may be ignored. The transverse acoustic velocity is obtained by taking the square root of the elastic modulus divided by the density. However, an acoustic velocity of the piezoelectric body 3 to be compared to the acoustic velocities of the intermediate layer 17 and the support substrate 15 may be the acoustic velocity in the central region RC (or the crossing region R0 in a case where the electrode fingers 11 have a constant width along their entire length) of the acoustic waves of the mode being utilized instead of the transverse acoustic velocity. The acoustic velocity of the intermediate layer 17 and/or the support substrate 15 may be the acoustic velocity of bulk waves of a mode that has a relatively greater effect on leakage of the energy of acoustic waves of the utilized mode.

The combination of the material of the intermediate layer 17 serving as a low acoustic velocity layer and the material of the support substrate 15 serving as a high acoustic velocity layer may be chosen as appropriate. For example, the combination of these materials may be the combination of $SiO_2$ and Si described above. In the case where the intermediate layer 17 is provided as a low acoustic velocity layer, a layer that improves the bonding strength between the intermediate layer 17 and the piezoelectric body 3 may be provided and/or a relatively thin layer that improves the bonding strength between the intermediate layer 17 and the support substrate 15 may be provided.

FIG. 7 is a sectional view illustrating the configuration of a substrate 13B as a second example of a substrate. The illustrated cross section corresponds to a cross section taken along line VI-VI in FIG. 1.

The substrate 13B includes a multilayer film 19 instead of the intermediate layer 17 in the previously described substrate 13A. The multilayer film 19 includes two or more (six in the illustrated example) acoustic films (first films 21A and second films 21B). Among the multiple acoustic films, the materials of acoustic films that are adjacent to each other in the stacking direction (stacked without another acoustic film therebetween) are different from each other. From another perspective, adjacent acoustic films have different acoustic impedances from each other. As a result, for example, the reflectivity of acoustic waves at the boundary between two different layers is comparatively high. As a result, for example, leakage of acoustic waves propagating through the piezoelectric body 3 is reduced. The combination of the intermediate layer 17 and the support substrate 15 in the substrate 13A in FIG. 6 may be considered as a type of multilayer film. A multilayer film including the support substrate 15 may be defined in the substrate 13B in FIG. 7.

The number of different types of acoustic film materials and the number of acoustic films in the multilayer film 19 may be set as appropriate. In the illustrated example, the two types of acoustic films (first films 21A and second films 21B) are stacked in an alternating manner for three or more layers (more specifically, six layers). The materials of the acoustic films may be chosen as appropriate. For example, the material of the first films 21A may be silicon dioxide ($SiO_2$). The material of the second films 21B may be tantalum pentoxide ($Ta_2Os$), hafnium oxide ($HfO_2$), zirconium dioxide ($ZrO_2$), titanium oxide ($TiO_2$), magnesium oxide (MgO), or silicon nitride ($Si_3N_4$). In this case, the first films 21A have a lower acoustic impedance than the second films 21B, for example. The thicknesses of the acoustic films may be set as appropriate, and for example, the description of the thickness of the intermediate layer 17 may be applied.

The acoustic films (first films 21A and second films 21B) may constitute low-acoustic-velocity films and high-acoustic-velocity films, similarly to the intermediate layer 17 and the support substrate 15 of the substrate 13A in FIG. 6. For example, the first films 21A may be composed of a material (for example, $SiO_2$ or $Ta_2O_5$) having a lower acoustic velocity than the piezoelectric body 3. The second films 21B may be composed of a material (for example, $Si_3N_4$) having a higher acoustic velocity than the piezoelectric body 3.

Although not specifically illustrated, a substrate containing the piezoelectric body 3 may have any of various configurations other than the above examples. For example, the substrate may be almost entirely constituted by the piezoelectric body 3. From another perspective, the piezoelectric body 3 may be relatively thick. The substrate may include a cavity below a relatively thin (for example, a thickness less than or equal to 2p or 1p) piezoelectric body 3. The substrate may also include, separately from the support substrate 15, a high acoustic velocity layer that stacked on the bottom surface of the intermediate layer 17 serving as a low acoustic velocity layer in the substrate 13A in FIG. 6. In contrast to the description of substrates 13A and 13B, confinement of acoustic waves may be realized by stacking a high acoustic velocity layer on the bottom surface of the piezoelectric body 3.

(Other Configurations of Acoustic Wave Devices)

Although not specifically illustrated, the acoustic wave device 1 may include an insulating protective film covering the top surface 3a of the piezoelectric body 3 from above the conductor layer including the IDT electrode 5. The protective film may, for example, contribute to reducing corrosion of the conductor layer and/or contribute to temperature compensation. For example, $SiO_2$, $Si_3N_4$ and Si can be used as the material of the protective film. The protective film may be a multilayer body consisting of these materials.

The device 1 may also include an additional film stacked on the top surface or the bottom surface of the IDT electrode 5. The additional film, for example, is stacked on part of or the entirety of the IDT electrode 5 and has a shape that fits within the IDT electrode 5 in planar perspective view. Such an additional film is composed of an insulating or metal material having different acoustic properties from the material of the IDT electrode 5, for example, and contributes to improving the reflection coefficient of acoustic waves.

The device 1 may be packaged as appropriate. The following can be given as examples of the configuration of the package. A package in which the substrate 13A (or 13B and so on) is mounted on a substrate, which is not illustrated, so that the top surface 3a of the piezoelectric body 3 faces the substrate with a gap therebetween, the substrate 13A being sealed with molding resin from above. Alternatively, a wafer-level package in which a box-shaped cover covering the top surface 3A is provided on the substrate 13A (or 13B and so on).

(Summary of Acoustic Wave Device)

As described above, the acoustic wave device 1 includes the piezoelectric body 3 and the IDT electrode 5. The piezoelectric body 3 has the first surface (top surface 3a). The IDT electrode 5 is positioned on the top surface 3a. The IDT electrode 5 includes the following sections. First busbar (busbar 9 of one comb electrode 7). Second busbar facing first busbar (busbar 9 of other comb electrode 7). Multiple first electrode fingers electrically connected to first busbar (electrode fingers 11 of one comb electrode 7). Multiple second electrode fingers (electrode fingers 11 of other comb electrode 7) electrically connected to second busbar and arranged in an alternating manner with the multiple first electrode fingers in the acoustic wave propagation direction (D1 direction). Multiple bar electrodes 43 interposed between the first busbar and the multiple first electrode fingers, extending parallel to the first busbar and parallel to each other (here, the bar electrodes 43 of one comb electrode 7 are taken as an example). Multiple (at least two) connection portions 45 including a connection portion 45 that is interposed between the first busbar and the bar electrode 43 adjacent to the first busbar and that connects the first busbar and the bar electrode 43 to each other, and a connection portion 45 that is interposed between adjacent bar electrodes 43 and that connects the adjacent bar electrodes 43 to each other. At least some of the multiple connection portions 45 are disposed in a discontinuous manner with respect to the direction of extension of the multiple electrode fingers 11 (D2 direction).

Therefore, for example, the reflection positions of transverse mode spurious can be dispersed compared to a case in which multiple connection portions 45 are disposed in a continuous manner with respect to the D2 direction, as described previously. As a result, the wavelengths and the positions of the nodes and anti-nodes of transverse mode spurious can be dispersed and this reduces strengthening of transverse mode spurious. Consequently, spurious can be reduced.

The multiple connection portions 45 may be arranged in a direction inclined with respect to the direction of extension (D2 direction) of the electrode fingers 11 (FIGS. 2 to 5).

In this case, for example, the more the reflection positions around the connection portions 45 are positioned toward one side in the D1 direction, the more the reflection positions are positioned toward the +D2 side or the −D2 side. In this way, the reflection positions of transverse mode spurious can be reliably and efficiently dispersed and strengthening of transverse mode spurious can be reduced. In particular, this effect is improved when multiple connection portions 45 are arranged diagonally from the bar electrode 43 closest to the electrode fingers 11 to the busbar 9.

The multiple connection portions 45 may be disposed in a V-shape that closes toward the side where the multiple electrode fingers 11 are located (FIG. 2, FIGS. 3A to 3D).

In this case, for example, two straight lines made up of arrays of multiple connection portions 45 and inclined with respect to the D2 direction intersect each other, and therefore the effect of dispersing the reflection positions without any gaps in the D1 direction is easier to realize than in a case where the two straight lines are separated from each other. As a result, the effect of reducing transverse mode spurious is improved.

The multiple connection portions 45 may be disposed in a Y-shape that opens toward the side where the multiple electrode fingers 11 are located (FIG. 3B).

In this case, for example, substantially the same effect as described above is achieved because the Y-shape includes a V-shape. In addition, for example, the size in the D2 direction of the V-shape contained in the Y-shape can be adjusted. The bar electrodes 43 that remain after the adjustment are maintained at the same potential by the I-shape contained in the Y-shape.

In plan view of the top surface 3a of the piezoelectric body 3, the region where the IDT electrode 5 is located may include the following regions. The busbar region RB in which the busbar 9 is positioned. The intervening region RI in which the multiple bar electrodes 43 and the multiple connection portions 45 are positioned. The gap region RG in which the gaps G1 adjacent to the intervening region RI are positioned with respect to tips of the multiple second electrode fingers (the electrode fingers 11 of the comb electrode 7 that meshes with comb electrode 7 to which the intervening electrode 41 being focused on belongs). The crossing region R0 in which the electrode fingers 11 of the pair of comb electrodes 7 overlap in the acoustic wave propagation direction (D1 direction). In addition, the crossing region R0 may include the following regions. The central region RC positioned in the center of the crossing region R0 in the D2 direction and having a lower acoustic velocity than the gap regions RG. The edge region RE located between the central region RC and the gap region RG and having a lower acoustic velocity than the central region RC. The intervening region RI may have a higher acoustic velocity than the busbar region RB.

In this case, for example, transverse mode spurious is reduced due to the use of a piston mode, and therefore transverse mode spurious can be further reduced. If the acoustic velocity of the intervening regions RI is lower than the acoustic velocity of the busbar regions RB, the intervening electrodes 41 function like the busbars 9, and the significance of providing the intervening electrodes 41 between the busbars 9 and the gap regions RG is reduced. Consequently, the effect of dispersing reflection positions of transverse mode spurious is reduced. However, such a drawback is reduced due to the acoustic velocity of the intervening regions RI being higher than the acoustic velocity of the busbar regions RB.

The edges of the multiple connection portions 45 located on one side (+D1 side or −D1 side) in the acoustic wave propagation direction may be positioned on the same straight line inclined with respect to the extension direction (D2 direction) of the electrode fingers 11 or on the same curved line (FIGS. 2 to 3D).

In this case, for example, compared to a case in which the edges are parallel to the D2 direction (FIGS. 4A to 4E), the reflection positions of transverse mode spurious can be realized by the edges of the connection portions 45 and the positions can be made to vary in the D2 direction depending on the position in the D1 direction. As a result, the effect of reducing spurious is improved.

Two or more connection portions 45 with different positions in the acoustic wave propagation direction (D1 direction) may be positioned between adjacent bar electrodes 43 (in each slit region S1). The shape of a region enclosed by the two or more connection portions 45 and the bar electrodes 43 connected by the two or more connection portions 45 (opening region 47) may be an elliptical shape.

In this case, for example, the edges of one opening region 47 can form the reflection positions of transverse mode spurious and the positions can be made to vary in the D2 direction depending on the position in the D1 direction. As a result, the effect of reducing spurious is improved.

The device 1 may further include multiple dummy electrodes 25. The multiple dummy electrodes 25 may be connected to the bar electrode 43 (bar electrode 43 with the same potential as the first electrode fingers) positioned closest to the multiple first electrode fingers (electrode fingers 11 of one comb electrode 7) with the tips of the dummy electrodes 25 facing the tips of the multiple second electrode fingers (electrode fingers 11 of the other comb electrode 7) across the gaps G1.

In this case, for example, adjusting the distance between the gaps G1 and the intervening electrode 41 is easy. Since the gaps G1 are the areas where acoustic wave diffraction occurs and affect transverse mode spurious, spurious can be easily reduced by adjusting the above distance. In addition, for example, transverse-mode spurious can also be reduced by apodizing the IDT electrode 5 by varying the positions of the gaps G1 in the D2 direction relative to the positions in the D1 direction while keeping the size of the gaps G1 constant.

The acoustic wave device 1 may further include a low-acoustic-velocity film (intermediate layer 17 in FIG. 6 or first films 21A in FIG. 7) and a high-acoustic-velocity film (support substrate 15 in FIG. 6 or second films 21B in FIG. 7). The low-acoustic-velocity film is stacked on the opposite side of the piezoelectric body 3, which is composed of a piezoelectric film, from the top surface 3a of the piezoelectric body 3 and has a lower acoustic velocity than the piezoelectric body 3. The high-acoustic-velocity film is stacked on the opposite side of the low-acoustic-velocity film from the piezoelectric body 3 and has a higher acoustic velocity than the piezoelectric body 3.

In this case, for example, leaking of acoustic waves from the piezoelectric body 3 can be reduced. As a result, the characteristics of the device 1 are improved.

<Example Uses of Acoustic Wave Device>

The acoustic wave device 1 may be used in various forms such as resonators and filters. Hereafter, example uses of acoustic wave devices will be described. Specifically, the description is generally given in the following order.

Example of Resonator
Example of Splitter
Example of Communication Device

Resonators, splitters, and communication devices are all example uses of acoustic wave devices. In the description of the splitter, an example of a filter is also described as an example use of an acoustic wave device.

(Example of Resonator)

Figure 8:
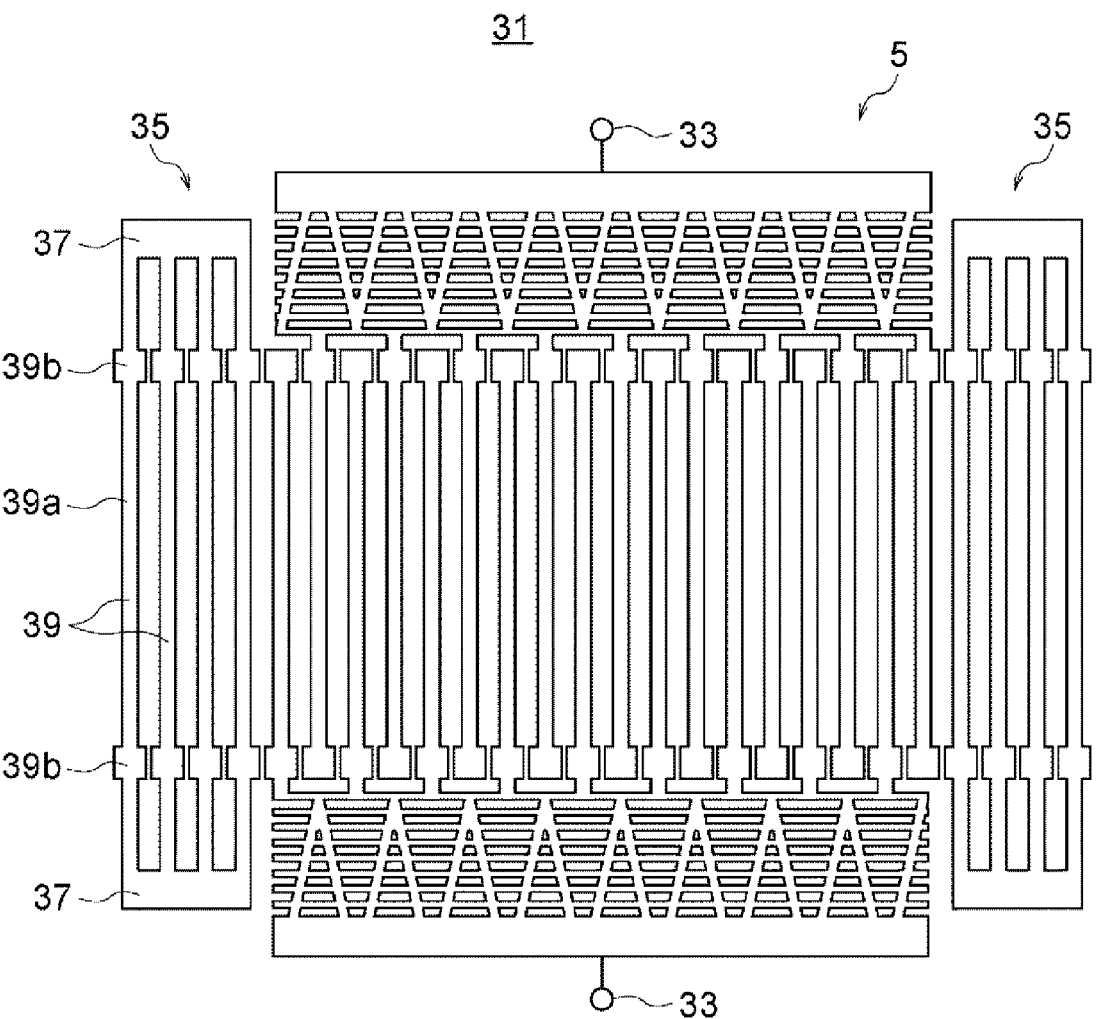
FIG. 8 is a plan view illustrating the configuration of an acoustic wave resonator according to an embodiment.
Figure 8:
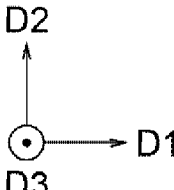

FIG. 8 is a plan view illustrating the configuration of a resonator 31. In the following description, refer to FIG. 1 and so on for symbols relating to the IDT electrode 5.

The resonator 31 is configured as a so-called one-port acoustic wave resonator. The resonator 31 can generate resonance when input with an electrical signal of a prescribed frequency from one of two terminals 33, illustrated conceptually and schematically in FIG. 8, and can output a signal that generated the resonance from the other of the two terminals 33.

The resonator 31 includes, for example, the piezoelectric body 3 (refer to FIG. 6 and so on), as well as the IDT electrode 5 and a pair of reflectors 35 located on the top surface 3a of the piezoelectric body 3. The resonator 31 may be regarded as including the acoustic wave device 1 or may be regarded as being included in the device 1. The resonator 31 also includes the piezoelectric body 3 (and other layers that affect acoustic waves), as described above. For convenience, however, the combination of the IDT electrode 5 and the pair of reflectors 35 may be referred to as the resonator 31.

The pair of reflectors 35 consists of the same conductor layer as the conductor layer constituting the IDT electrode 5, for example. In a configuration in which additional films overlap all or parts of the IDT electrode 5, additional films may be provided that overlap all or parts of the reflectors 35. The pair of reflectors 35 are positioned on both sides of the IDT electrode 5 in the acoustic wave propagation direction. Each reflector 35 may be electrically floating or supplied with a reference potential, for example.

Each reflector 35 is formed in the shape of a lattice, for example. In other words, each reflector 35 includes a pair of busbars 37 facing each other and multiple strip electrodes 39 extending between the pair of busbars 37. Similarly to the multiple electrode fingers 11, the multiple strip electrodes 39 may be actually provided in a greater number than is illustrated.

The busbars 37 generally have substantially the same configuration as the busbars 9 of the IDT electrode 5, for example, and the description of the busbars 9 may be applied to the busbars 37. The positions of the busbars 37 in the D2 direction may be, for example, appropriate positions outside the gap regions RG. In the illustrated example, the busbars 37 are positioned within the ranges in which the intervening electrodes 41 are disposed in the D2 direction. The width of busbars 37 (in the D2 direction) may be smaller than, equal to, or larger than the width of busbars 9. When the busbars 9 are inclined with respect to the acoustic wave propagation direction, the busbars 37 may be inclined with respect to the acoustic wave propagation direction similarly to the busbars 9 or may be parallel to the acoustic wave propagation direction.

The schematic configuration of the multiple strip electrodes 39 is substantially the same as the schematic configuration of the electrode fingers 11 of the IDT electrode 5, except that the strip electrodes 39 span between the pair of busbars 37. The description of electrode fingers 11 may be applied to the strip electrodes 39 as appropriate. The multiple strip electrodes 39 are arranged in the acoustic wave propagation direction so as to follow the arrangement of the multiple electrode fingers 11. The pitch of the multiple strip electrodes 39 and the pitch of the electrode fingers 11 adjacent to the reflectors 35 and the strip electrodes 39 adjacent to the IDT electrode 5 are identical to the pitch of the multiple electrode fingers 11, for example.

The specific planar shape of the strip electrodes 39 (or, from another perspective, the changes in the width (length in the D1 direction) depending on the position in the D2 direction) may be chosen as appropriate. In the illustrated example, similarly to the electrode fingers 11, each strip electrode 39 includes a main portion 39a and a wider portion 39b. The main portions 39a overlap the main portions 11a of the electrode fingers 11 in the D2 direction. The wider portions 39b overlap wider portions 39b of the electrode fingers 11 in the D2 direction. The description of the main portions 11a and the wider portions 11b may be applied to the main portions 39a and the wider portions 39b.

In the illustrated example, the reflectors 35 do not include parts corresponding to the intervening electrodes 41. However, the reflectors 35 may include parts corresponding to the intervening electrodes 41.

(Example of Splitter)

Figure 9:
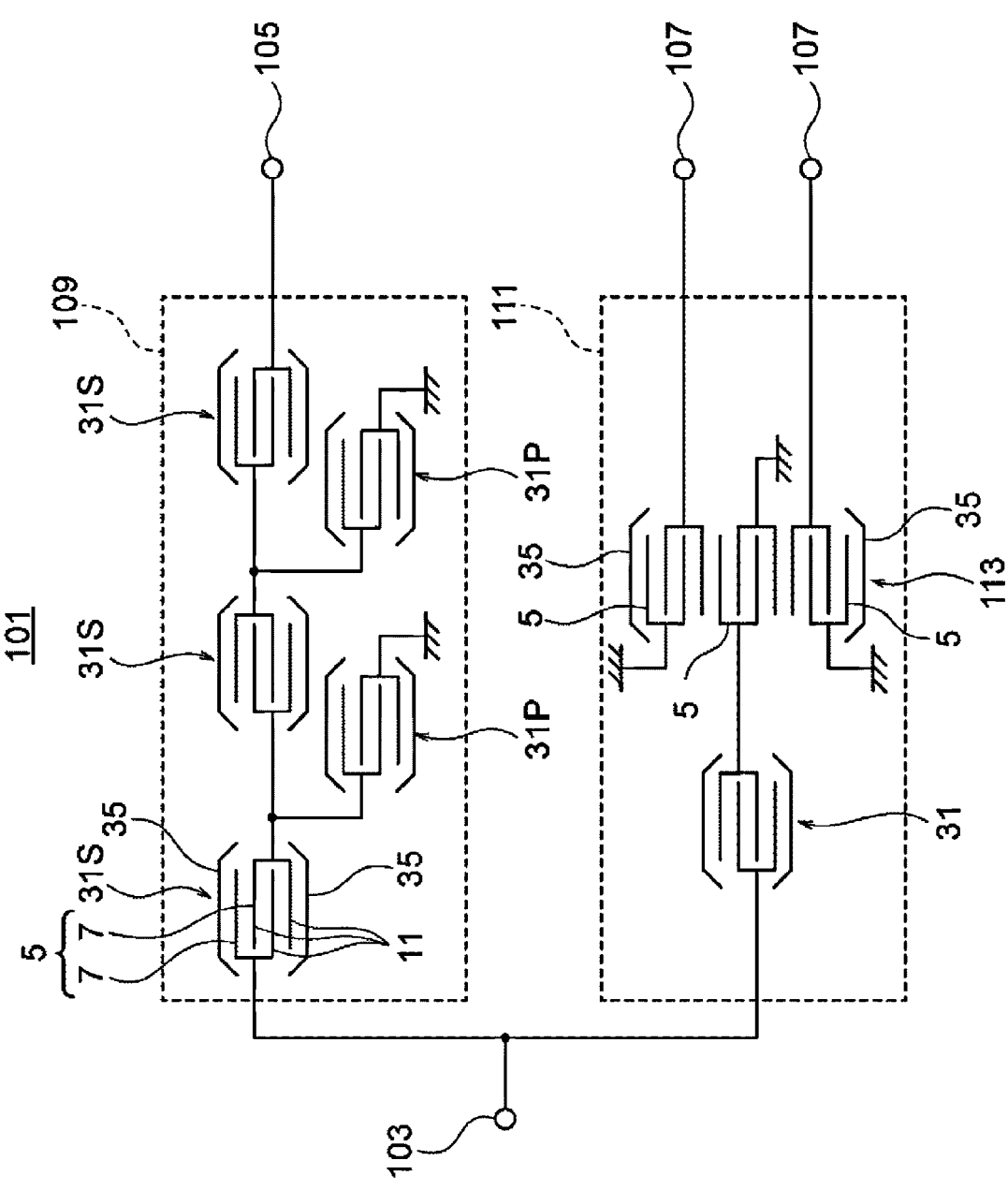
FIG. 9 is a circuit diagram schematically illustrating the configuration of a splitter according to an embodiment.

FIG. 9 is a circuit diagram schematically illustrating the configuration of a splitter 101 (for example, a duplexer). In this figure, the comb electrodes 7 are each schematically illustrated in the shape of a two-pronged fork, and the reflectors 35 are each represented by a single line bent at both ends, as indicated by the symbols in the upper left corner of the figure.

The splitter 101 includes, for example, a transmission filter 109 that filters a transmission signal from a transmission terminal 105 and outputs the filtered transmission signal to an antenna terminal 103, and a reception filter 111 that filters a reception signal from the antenna terminal 103 and outputs the filtered reception signal to a pair of reception terminals 107.

The transmission filter 109 is configured, for example, as a ladder filter consisting of multiple resonators 31 (series resonators 31S and parallel resonators 31P) connected to each other in a ladder configuration. In other words, the transmission filter 109 includes multiple (or just one) series resonators 31S connected in series with each other between the transmission terminal 105 and the antenna terminal 103, and multiple (or just one) parallel resonators 31P (parallel arms) connecting the series line (series arm) to a reference potential part (symbol omitted).

The reception filter 111 includes, for example, a resonator 31 and a multi-mode filter (which is assumed to include a dual-mode filter) 113. The multi-mode filter includes a dual-mode filter. The multi-mode filter 113 includes multiple (three in the illustrated example) IDT electrodes 5 arranged in the acoustic wave propagation direction and a pair of reflectors 35 disposed on both sides of the IDT electrodes.

At least one of the multiple resonators of the transmission filter 109 (ladder filter) may include the acoustic wave device 1 (IDT electrode 5) according to the embodiment. In a representation based on the one IDT electrode 5 possessed by the device 1, the transmission filter 109 includes the device 1 and one or more other IDT electrodes (in the illustrated example, the other IDT electrodes are also the IDT electrode 5 according to the embodiment) located on the top surface 3a of the piezoelectric body 3 of the device 1 and connected to the one IDT electrode 5 in a ladder configuration to form a ladder filter.

At least one of the multiple IDT electrodes of the multimode filter 113 may include the acoustic wave device 1 (IDT electrode 5) according to the embodiment. In a representation based on the one IDT electrode 5 possessed by the device 1, the multi-mode filter 113 includes the device 1 and one or more other IDT electrodes (in the illustrated example, the other IDT electrodes are also the IDT electrode 5 according to the embodiment) located on the top surface 3a of the piezoelectric body 3 of the device 1 and arranged in the acoustic wave propagation direction with respect to the one IDT electrode 5 to form a multi-mode filter.

Each of the splitter 101, the transmission filter 109 (ladder filter), the reception filter 111, and the multi-mode filter 113 may be considered to include the device 1 according to the embodiment, or may be considered to be included in the device 1.

The multiple IDT electrodes 5 (and reflectors 35) of the splitter 101 may be provided on a single piezoelectric body 3 (substrate) or provided so as to be distributed over two or more piezoelectric bodies 3. For example, the multiple resonators 31 constituting the transmission filter 109 may be located on the same piezoelectric body 3. Similarly, the resonator 31 and the multi-mode filter 113 constituting the reception filter 111 may be provided on the same piezoelectric body 3, for example. The transmission filter 109 and the reception filter 111 may be provided on the same piezoelectric body 3, for example, or on different piezoelectric bodies 3 from each other. In addition to the above, for example, the multiple series resonators 31S may be provided on the same piezoelectric body 3, and the multiple parallel resonators 31P may be provided on another piezoelectric body 3.

FIG. 9 is just an example of the configuration of the splitter 101. Therefore, for example, the reception filter 111 may be configured as a ladder filter similarly to the transmission filter 109. The transmission filter 109 may include the multi-mode filter 113. The splitter 101 is not limited to being a duplexer, and for example, may be a diplexer or may be a multiplexer containing three or more filters.

(Communication Device)

Figure 10:
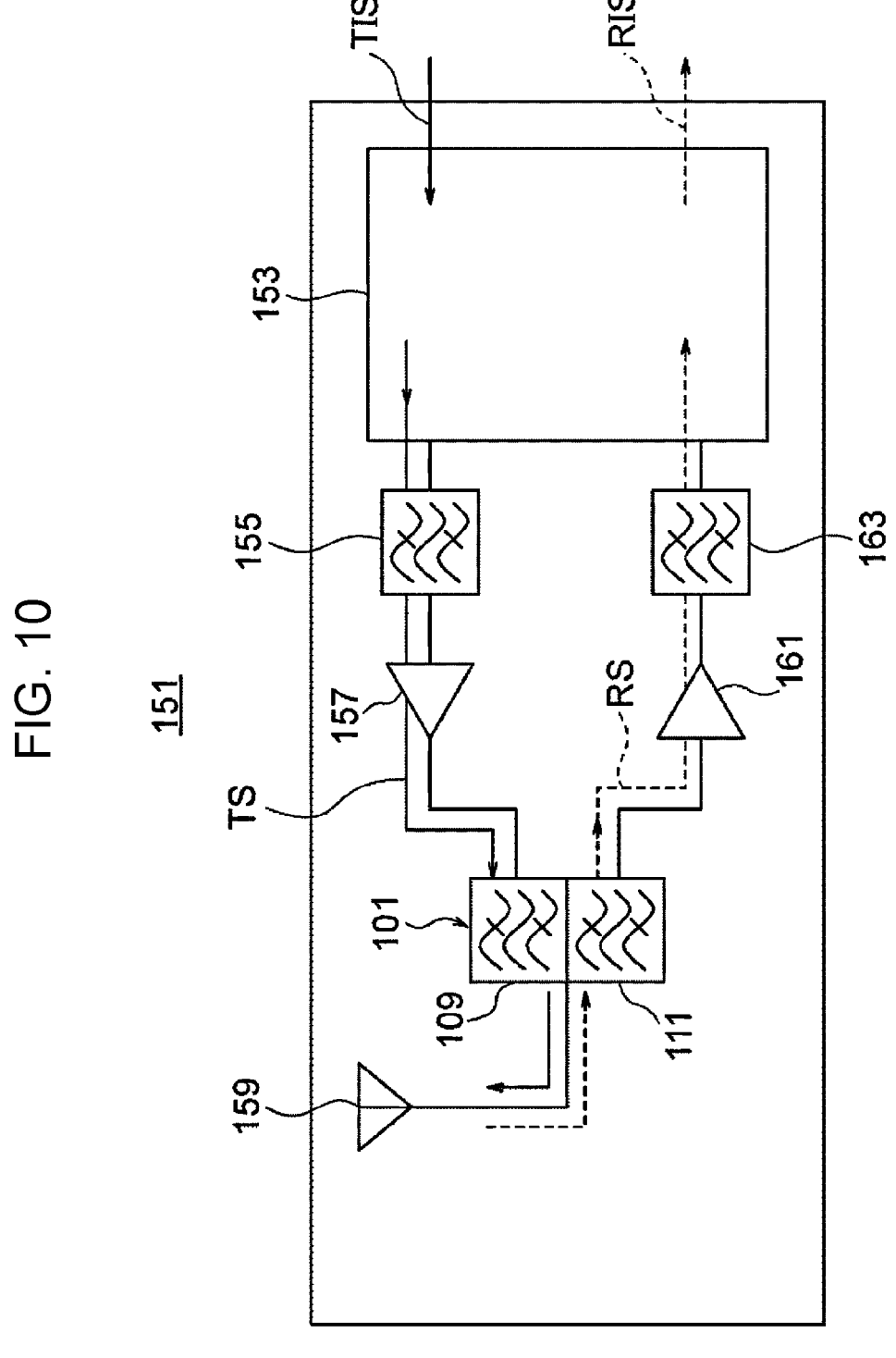
FIG. 10 is a block diagram illustrating the configuration of a communication device according to an embodiment.

FIG. 10 is a block diagram illustrating main parts of a communication device 151 as an example use of the acoustic wave device 1. The communication device 151 performs wireless communication using radio waves and includes the splitter 101.

In the communication device 151, a transmission information signal TIS, which contains information to be transmitted, is modulated and raised in frequency (converted to a radio-frequency signal having a carrier frequency) by a radio frequency integrated circuit (RF-IC) 153, and becomes a transmission signal TS. Unwanted components outside a transmission passband are removed from the transmission signal TS by a bandpass filter 155, and the resulting transmission signal TS is then amplified by an amplifier 157 and input to the splitter 101 (transmission terminal 105). The splitter 101 (transmission filter 109) removes unwanted components outside the transmission passband from the input transmission signal TS, and then outputs the transmission signal TS resulting from the removal from the antenna terminal 103 to an antenna 159. The antenna 159 converts the input electrical signal (transmission signal TS) into a radio signal (radio waves) and transmits the radio signal.

In the communication device 151, a radio signal (radio waves) received by the antenna 159 is converted into an electrical signal (reception signal RS) by the antenna 159 and input to the splitter 101 (antenna terminal 103). The splitter 101 (reception filter 111) removes unwanted components outside a reception passband from the input reception signal RS and outputs the resulting reception signal RS from the reception terminal 107 to an amplifier 161. The output reception signal RS is amplified by the amplifier 161, and unwanted components outside the reception passband are removed by a bandpass filter 163. The reception signal RS is then reduced in frequency and demodulated by the RF-IC 153, and becomes a reception information signal RIS.

The transmission information signal TIS and the reception information signal RIS may be low-frequency signals (baseband signals) containing appropriate information, for example, analog or digitized audio signals. The radio signal passband may be set as appropriate and may conform to any of various known standards. The modulation method may be phase modulation, amplitude modulation, frequency modulation, or a combination of any two or more of these methods. Although the direct conversion method is illustrated as an example, other types of circuit may be used as appropriate, for example, a double superheterodyne type circuit. FIG. 10 is a diagram schematically illustrating only the main parts, and a low-pass filter, an isolator, and so on may be added at appropriate positions, and the positions of amplifiers and so on may be changed.

The acoustic wave device 1 may be used in various forms other than those described above. For example, the acoustic wave device 1 may be used in a two-port resonator or in a transversal filter.

Practical Examples

The effect of the acoustic wave device 1 according to the embodiment was confirmed by measuring the characteristics of test pieces of the resonator 31 according to the embodiment (FIG. 8) and by calculating the characteristics of the resonator 31 through simulations. Some examples of the results of the simulation calculations are described below.

First Comparative Example and First Practical Example

Figure 11:
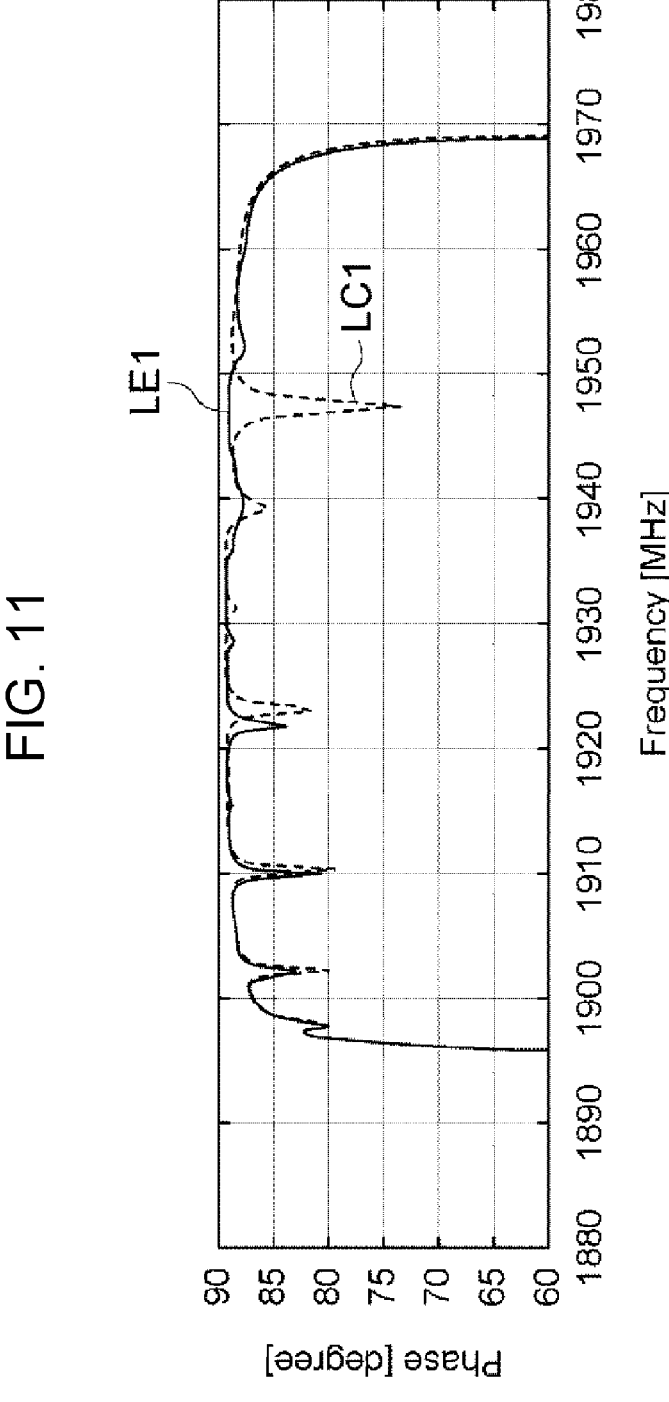
FIG. 11 is a diagram illustrating characteristics of resonators according to a First Comparative Example and a First Practical Example.

FIG. 11 is a diagram illustrating the characteristics of resonators according to a First Comparative Example and a First Practical Example.

In FIG. 11, the horizontal axis represents frequency. The vertical axis represents phase of impedance. A line LC1 represents a characteristic of the First Comparative Example. A line LE1 represents a characteristic of the First Practical Example.

The resonator 31 has a resonant frequency at which the absolute value of impedance is a minimum value and an anti-resonant frequency at which the absolute value of impedance is a maximum value. Generally, in the range between the resonant frequency and the anti-resonant frequency, the closer the phase of the impedance is to 90°, the better the characteristic of the resonator 31 is. Outside the above range, the closer the phase of the impedance is to −90°, the better the characteristic of the resonator 31 is. In FIG. 11, the range on the horizontal axis roughly corresponds to the range between the resonant frequency and the anti-resonant frequency.

In the First Practical Example, the IDT electrode 5 has substantially the same configuration as the IDT electrode 5A according to the first example illustrated in FIG. 2. The First Comparative Example has a configuration obtained by removing the multiple connection portions 45 from the First Practical Example. However, in each comb electrode 7, the multiple bar electrodes 43 and the busbar 9 are assumed to be at the same potential as each other (electrically connected).

As illustrated in FIG. 11, the number of spurious components and the magnitudes of the spurious components are reduced in the First Practical Example compared to the First Comparative Example. In other words, the fact that spurious is reduced by providing multiple connection portions 45 in a discontinuous manner in the D2 direction was confirmed.

Specific parameters of the simulation calculations are listed below.

Piezoelectric Body:
    Material: LT
    Cut angle: 50° rotated Y-cut X-propagation
    Thickness: 0.65 μm
Low Acoustic Velocity Layer (Intermediate Layer 17):
    Material: SiO$_2$
    Thickness: 0.22 μm
High Acoustic Velocity Layer (Support Substrate 15):
    Material: Si
    Thickness: sufficient thickness with respect to pitch p (200 μm)
IDT Electrode:
    Material: multilayer structure consisting of Ti and Al
    Thickness:
    Ti: 60 Å
    Al: 1400 Å
    Electrode fingers:
    Number: 250
    Pitch: 1.03 μm
    Main portion duty: 0.50
    Wider portion duty: 0.60
    Length of one wider portion (D2 direction): 1.0 μm
    Width of crossing region R0: 40p
    Length (D2 direction) of gaps G1: 0.3 μm
    Bar electrodes:
    Number: 8
    Width (D2 direction): 0.25p
    Bar electrode spacing (width of slit region S1): 0.25p
Reflectors:
    Material and thickness: same as IDT electrode
    Strip electrodes:
    Number: 30 (one reflector)
    Pitch: same as pitch of electrode fingers

First to Third Practical Examples

Figure 12:
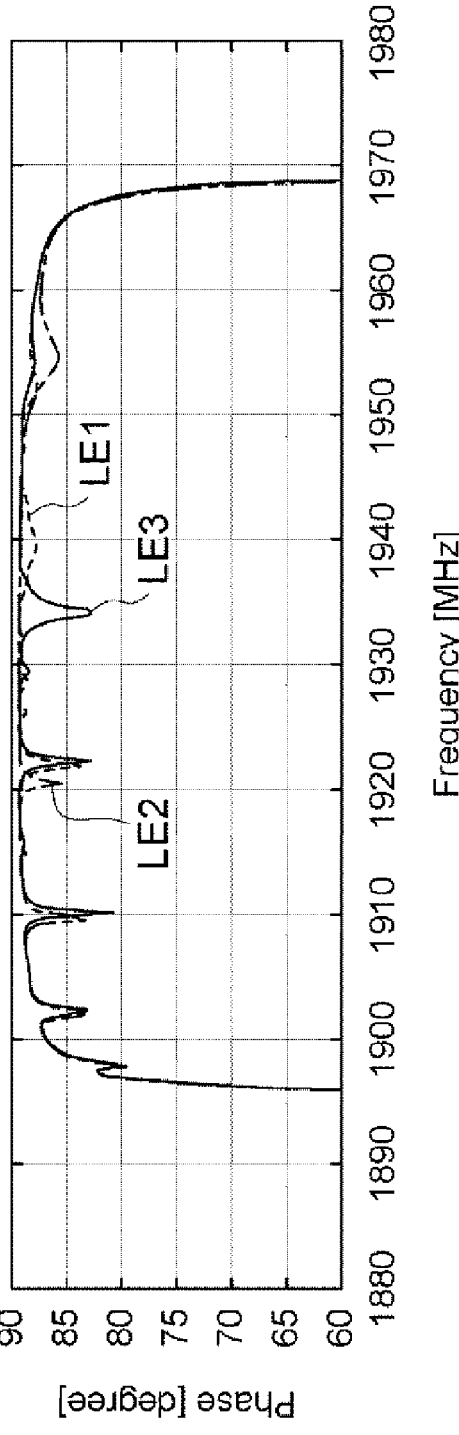
FIG. 12 is a diagram illustrating characteristics of resonators according to First to Third Practical Examples.

FIG. 12 is a diagram illustrating the characteristics of resonators according to First to Third Practical Examples, and is similar to FIG. 11. In FIG. 12, line LE1 represents the characteristics of the First Practical Example and is identical to line LE1 illustrated in FIG. 11. Lines LE2 and LE3 respectively represent the characteristics of the Second and Third Practical Examples.

The Second Practical Example has substantially the same configuration as the IDT electrode 5B according to the second example illustrated in FIG. 3A as the IDT electrode 5. That is, in the First Practical Example, the size of the V-shape in the D2 direction is roughly 2p, whereas in the Second Practical Example, the size of the V-shape in the D2 direction is roughly 1p. The Third Practical Example has substantially the same configuration as the IDT electrode 5C according to the third example illustrated in FIG. 3B. However, for the I-shaped portion contained in the Y shape, the connection portions 45 are eliminated and the multiple bar electrodes 43 and busbar 9 are assumed to be at the same potential as each other (electrically connected to each other).

As illustrated in FIG. 12, generally, spurious is lower in the Second Practical Example than in the First Practical Example, and spurious is lower in the First Practical Example than in the Third Practical Example. In other words, the greater the change in the positions of the connection portions 45 in the D2 direction relative to the positions in the D1 direction, the more the spurious is reduced. Note that the First Practical Example is easier to manufacture than the Second Practical Example.

Second and Third Comparative Examples and Fourth Practical Example

Figure 13:
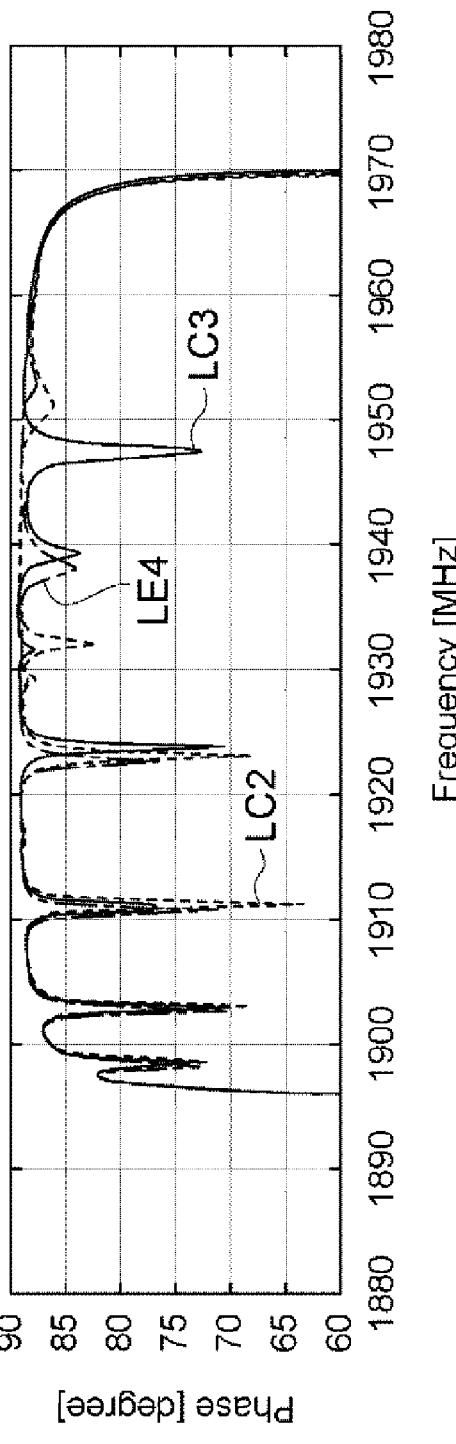
FIG. 13 is a diagram illustrating characteristics of resonators according to Second and Third Comparative Examples and a Fourth Practical Example.

FIG. 13 is a diagram illustrating the characteristics of resonators according to Second and Third Comparative Examples and a Fourth Practical Example, and is similar to FIG. 11. In FIG. 13, lines LC2, LC3, and LE4 represent the characteristics of the Second and Third Comparative Examples and the Fourth Practical Example, respectively.

The Fourth Practical Example has substantially the same configuration as an IDT electrode 5D according to a fourth example illustrated in FIG. 3C as the IDT electrode 5. In other words, the Fourth Practical Example is obtained by making the width of the electrode fingers 11 constant over the entire length of the electrode fingers 11 in the First Practical Example. The Second Comparative Example is obtained by eliminating the intervening electrodes 41 by widening the busbars 9 into the regions where the intervening electrodes 41 are disposed in the Fourth Practical Example. The Third Comparative Example is obtained by removing the multiple connection portions 45 from the Fourth Practical Example. However, in the Fourth Practical Example, the multiple bar electrodes 43 and the busbar 9 of each comb electrode 7 are assumed to be at the same potential as each other (electrically connected to each other).

As illustrated in FIG. 13, generally, spurious is reduced in the Fourth Practical Example compared to the Second and Third Comparative Examples. This confirms that even if a piston mode is not used by the IDT electrode 5, spurious is reduced by disposing the multiple connection portions 45 in a discontinuous manner with respect to the D2 direction.

Although not specifically illustrated, simulation calculations were also performed for a comparative example obtained by reducing the thickness of the busbars in the Second Comparative Example. From another perspective, simulation calculations were also performed for a comparative example in which the acoustic velocity in regions corresponding to the intervening regions RI was increased without providing the intervening electrodes 41. As a result, although reducing the thickness of the busbars was effective as a way of reducing spurious, the effect was less pronounced than in the practical examples. This confirmed that the spurious-reducing effect of the intervening electrodes 41 is due to the intervening electrodes 41 acting as reflectors for transverse mode spurious.

REFERENCE SIGNS

1 acoustic wave device, 3 piezoelectric body, 3a top surface (first surface), 5 IDT electrode, 9 busbars (first busbar, second busbar), 11 electrode fingers (first electrode fingers, second electrode fingers), 43 bar electrodes, 45 connection portions.

The invention claimed is:

1. An acoustic wave device comprising:
a piezoelectric body having a first surface; and
an IDT electrode positioned on the first surface,
wherein the IDT electrode includes
a first busbar,
a second busbar facing the first busbar,
multiple first electrode fingers electrically connected to the first busbar,
multiple second electrode fingers electrically connected to the second busbar and arranged in an alternating manner with the multiple first electrode fingers in an acoustic wave propagation direction,
multiple bar electrodes interposed between the first busbar and the multiple first electrode fingers, and extending parallel to the first busbar and parallel to each other, and
multiple connection portions including:
a first connection portion that is interposed between the first busbar and a corresponding one of the bar electrodes adjacent to the first busbar and that connects the first busbar to the corresponding one of the bar electrodes, and
a second connection portion that is interposed between and connects adjacent bar electrodes, among the bar electrodes, to each other, and
at least some of the multiple connection portions are disposed in a a V-shape that closes toward a side where the second busbar is located.

2. An acoustic wave device comprising:
a piezoelectric body having a first surface; and
an IDT electrode positioned on the first surface,
wherein the IDT electrode includes
a first busbar,
a second busbar facing the first busbar,
multiple first electrode fingers electrically connected to the first busbar,
multiple second electrode fingers electrically connected to the second busbar and arranged in an alternating manner with the multiple first electrode fingers in an acoustic wave propagation direction,
multiple bar electrodes interposed between the first busbar and the multiple first electrode fingers, and extending parallel to the first busbar and parallel to each other, and
multiple connection portions including
a first connection portion that is interposed between the first busbar and a corresponding one of the bar electrodes adjacent to the first busbar and that connects the first busbar to the corresponding one of the bar electrodes, and
a second connection portion that is interposed between and connects adjacent bar electrodes, among the bar electrodes, to each other, and
wherein at least some of the multiple connection portions are disposed in a Y shape that opens toward a side where the second busbar is located.

3. The acoustic wave device according to claim 1,
wherein a region in which the IDT electrode is located in plan view of the first surface includes
busbar regions in which the busbars are located,
an intervening region in which the multiple bar electrodes and the multiple connection portions are located,
a gap region in which a gap adjacent to a side of the intervening region is positioned with respect to tips of the multiple second electrode fingers, and a crossing region in which the multiple first electrode fingers and the multiple second electrode fingers overlap in the acoustic wave propagation direction, and
the crossing region includes
a central region located in a center of the crossing region in the extension direction and having a lower acoustic velocity than the gap region, and
an edge region located between the central region and the gap region and having a lower acoustic velocity than the central region, and
the intervening region has a higher acoustic velocity than the busbar regions.

4. The acoustic wave device according to claim 1,
wherein edges of the multiple connection portions positioned on one side in the acoustic wave propagation direction are located on a same straight line inclined with respect to the extension direction or on a same curved line.

5. The acoustic wave device according to claim 1,
wherein two or more of the connection portions that are at different positions in the acoustic wave propagation direction are located between each set of adjacent bar electrodes, among the bar electrodes, and
a shape of a region enclosed by the two or more connection portions and the bar electrodes connected to each other by the two or more connection portions is an elliptical shape.

6. The acoustic wave device according to claim 1, further comprising:
multiple dummy electrodes that are connected to a bar electrode positioned closest to the multiple first electrode fingers, among the multiple bar electrodes, with tips of the dummy electrodes facing tips of the multiple second electrode fingers across a gap.

7. The acoustic wave device according to claim 1, further comprising:
a low-acoustic-velocity film stacked on an opposite side of the piezoelectric body from the first surface and having a lower acoustic velocity than the piezoelectric body, the piezoelectric body being composed of a piezoelectric film; and
a high-acoustic-velocity film stacked on an opposite side of the low-acoustic-velocity film from the piezoelectric film and having a higher acoustic velocity than the piezoelectric body.

8. A filter comprising:
the acoustic wave device according to claim 1; and
one or more other IDT electrodes located on the first surface, connected to the IDT electrode in a ladder configuration, and constituting a ladder filter.

9. A filter comprising:
the acoustic wave device according to claim 1; and
one or more other IDT electrodes located on the first surface, arranged in the acoustic wave propagation direction with respect to the IDT electrode, and constituting a multi-mode filter.

10. A splitter comprising:
an antenna terminal;
a transmission filter connected to the antenna terminal; and
a reception filter connected to the antenna terminal,
wherein at least one out of the transmission filter and the reception filter is constituted by the filter according to claim 8.

11. A communication device comprising:
the splitter according to claim 10;
an antenna connected to the antenna terminal; and an IC connected to the transmission filter and the reception filter.

12. An acoustic wave device comprising:

a piezoelectric body having a first surface; and an IDT electrode positioned on the first surface, wherein the IDT electrode includes a first busbar, a second busbar facing the first busbar, multiple first electrode fingers electrically connected to the first busbar, multiple second electrode fingers electrically connected to the second busbar and arranged in an alternating manner with the multiple first electrode fingers in an acoustic wave propagation direction, multiple bar electrodes interposed between the first busbar and the multiple first electrode fingers, and extending parallel to the first busbar and parallel to each other, and multiple connection portions including a first connection portion that is interposed between the first busbar and a corresponding one of the bar electrodes adjacent to the first busbar and that connects the first busbar to the corresponding one of the bar electrodes, and a second connection portion that is interposed between and connects adjacent bar electrodes, among the bar electrodes, to each other, and at least some of edges of the multiple connection portions positioned on one side in the acoustic wave propagation direction are located on a same straight line inclined with respect to the extension direction or on a same curved line.

13. The acoustic wave device according to claim 12, wherein the multiple connection portions are arranged in a direction that is inclined with respect to the extension direction.

14. The acoustic wave device according to claim 2, wherein edges of the multiple connection portions positioned on one side in the acoustic wave propagation direction are located on a same straight line inclined with respect to the extension direction or on a same curved line.

15. The acoustic wave device according to claim 2, wherein two or more of the connection portions that are at different positions in the acoustic wave propagation direction are located between each set of adjacent bar electrodes, among the bar electrodes, and a shape of a region enclosed by the two or more connection portions and the bar electrodes connected to each other by the two or more connection portions is an elliptical shape.

16. The acoustic wave device according to claim 4, wherein two or more of the connection portions that are at different positions in the acoustic wave propagation direction are located between each set of adjacent bar electrodes, among the bar electrodes, and a shape of a region enclosed by the two or more connection portions and the bar electrodes connected to each other by the two or more connection portions is an elliptical shape.

17. The acoustic wave device according to claim 12, wherein two or more of the connection portions that are at different positions in the acoustic wave propagation direction are located between each set of adjacent bar electrodes, among the bar electrodes, and a shape of a region enclosed by the two or more connection portions and the bar electrodes connected to each other by the two or more connection portions is an elliptical shape.

18. The acoustic wave device according to claim 14, wherein two or more of the connection portions that are at different positions in the acoustic wave propagation direction are located between each set of adjacent bar electrodes, among the bar electrodes, and a shape of a region enclosed by the two or more connection portions and the bar electrodes connected to each other by the two or more connection portions is an elliptical shape.

19. The acoustic wave device according to claim 2, further comprising:

multiple dummy electrodes that are connected to a bar electrode positioned closest to the multiple first electrode fingers, among the multiple bar electrodes, with tips of the dummy electrodes facing tips of the multiple second electrode fingers across a gap.

20. The acoustic wave device according to claim 12, further comprising:

multiple dummy electrodes that are connected to a bar electrode positioned closest to the multiple first electrode fingers, among the multiple bar electrodes, with tips of the dummy electrodes facing tips of the multiple second electrode fingers across a gap.

* * * * *